(12) United States Patent
Shimadu et al.

(10) Patent No.: US 9,084,371 B2
(45) Date of Patent: Jul. 14, 2015

(54) WIRING SUBSTRATE AND MANUFACTURING METHOD FOR WIRING SUBSTRATE

(75) Inventors: Hitoshi Shimadu, Obu (JP); Kazunori Kondou, Obu (JP); Takehiko Sawada, Obu (JP); Takahiro Hayakawa, Obu (JP); Tomoaki Asai, Obu (JP); Ryou Yamauchi, Obu (JP)

(73) Assignee: KABUSHIKI KAISHA TOYOTA JIDOSHOKKI, Aichi-ken (JP)

( * ) Notice: Subject to any disclaimer, the term of this patent is extended or adjusted under 35 U.S.C. 154(b) by 36 days.

(21) Appl. No.: 13/386,835

(22) PCT Filed: Jul. 27, 2010

(86) PCT No.: PCT/JP2010/062638
§ 371 (c)(1),
(2), (4) Date: Jan. 24, 2012

(87) PCT Pub. No.: WO2011/013673
PCT Pub. Date: Feb. 3, 2011

(65) Prior Publication Data
US 2012/0119868 A1    May 17, 2012

(30) Foreign Application Priority Data

Jul. 27, 2009  (JP) ................................ 2009-174505
Jul. 27, 2009  (JP) ................................ 2009-174506
Dec. 4, 2009   (JP) ................................ 2009-276165

(51) Int. Cl.
*H05K 1/16*    (2006.01)
*H05K 1/18*    (2006.01)
(Continued)

(52) U.S. Cl.
CPC ............ *H05K 3/202* (2013.01); *H01L 23/3677* (2013.01); *H01L 23/49827* (2013.01);
(Continued)

(58) Field of Classification Search
CPC . H05K 1/0206; H05K 3/0061; H05K 1/0203; H05K 3/0058; H05K 1/056; H05K 3/28; H05K 3/429; H05K 1/0923; H05K 1/028; H05K 3/281; H05K 2201/09745; H05K 3/341; H05K 3/386; H05K 1/111; H01L 23/3677; H01L 23/49827; H01L 23/49861
See application file for complete search history.

(56) References Cited

U.S. PATENT DOCUMENTS 3,978,375 A    8/1976   Fukui et al.
5,223,676 A    6/1993   Yamamoto et al.
(Continued)

FOREIGN PATENT DOCUMENTS

DE    9305285 U1    6/1993
EP    0727841 A2    8/1996
(Continued)

OTHER PUBLICATIONS

Translation of International Preliminary Report on Patentability for corresponding International Patent Application No. PCT/JP2010/062638 issued Feb. 7, 2012.
(Continued)

*Primary Examiner* — Ishwarbhai B Patel
(74) *Attorney, Agent, or Firm* — Sughrue Mion, PLLC

(57) ABSTRACT

Disclosed is a wiring substrate that is provided with a wiring pattern formed from a metal plate, and an insulation layer as a base material to which the wiring pattern is to be fixed. The wiring pattern has a mounting pad for having electronic parts (11) surface-mounted. Electronic parts are mounted onto the surface of the wiring pattern, by pouring solder into the mounting pad of the wiring pattern.

13 Claims, 16 Drawing Sheets

(51) Int. Cl.
*H05K 1/02* (2006.01)
*H05K 3/20* (2006.01)
*H01L 23/367* (2006.01)
*H01L 23/498* (2006.01)
*H05K 1/11* (2006.01)
*H05K 3/34* (2006.01)
*H05K 3/38* (2006.01)

(52) U.S. Cl.
CPC ........ *H01L23/49861* (2013.01); *H05K 1/0201* (2013.01); *H05K 1/181* (2013.01); *H01L 2924/0002* (2013.01); *H05K 1/111* (2013.01); *H05K 3/341* (2013.01); *H05K 3/386* (2013.01); *H05K 2201/09745* (2013.01); *Y10T 29/49155* (2015.01)

(56) References Cited

U.S. PATENT DOCUMENTS

| | | | |
|---|---|---|---|
| 5,384,683 A * | 1/1995 | Tsunoda | 361/313 |
| 5,466,969 A | 11/1995 | Tsunoda | |
| 5,835,350 A * | 11/1998 | Stevens | 361/704 |
| 5,902,138 A | 5/1999 | Murakami | |
| 6,313,598 B1 * | 11/2001 | Tamba et al. | 318/722 |
| 6,787,700 B2 * | 9/2004 | Nagao et al. | 174/541 |
| 7,059,042 B2 * | 6/2006 | Hirano et al. | 29/832 |
| 7,808,089 B2 * | 10/2010 | Nguyen et al. | 257/676 |
| 8,259,459 B2 * | 9/2012 | Ueda et al. | 361/760 |
| 8,263,870 B2 * | 9/2012 | Tsumura et al. | 174/252 |
| 2003/0073349 A1 | 4/2003 | Nagao et al. | |
| 2004/0008531 A1 | 1/2004 | Arai et al. | |
| 2007/0262387 A1 * | 11/2007 | Nonaka et al. | 257/356 |
| 2008/0003846 A1 | 1/2008 | Miyagawa | |
| 2009/0237894 A1 | 9/2009 | Ueda et al. | |
| 2009/0266584 A1 * | 10/2009 | Tsumura et al. | 174/252 |

FOREIGN PATENT DOCUMENTS

| | | |
|---|---|---|
| JP | 03-021095 A | 1/1991 |
| JP | 03-222391 A | 1/1991 |
| JP | 03-283484 A | 12/1991 |
| JP | 05-167234 A | 7/1993 |
| JP | 07-263848 A | 10/1995 |
| JP | 08-181417 A | 7/1996 |
| JP | 10-012988 A | 1/1998 |
| JP | 2003-124416 A | 4/2003 |
| JP | 2003-249288 A | 9/2003 |
| JP | 2003-347691 A | 12/2003 |
| JP | 2004-128274 A | 4/2004 |
| JP | 2008-004809 A | 1/2008 |
| JP | 2008-010621 A | 1/2008 |
| JP | 2008-060109 A | 3/2008 |
| JP | 2008-263030 A | 10/2008 |
| JP | 2009-088162 A | 4/2009 |

OTHER PUBLICATIONS

Translation of International Preliminary Report on Patentability for corresponding International Patent Application No. PCT/JP2010/062838 issued Feb. 7, 2012.
Chinese Office Action dated Jan. 22, 2014 issued in corresponding Chinese Patent Application No. 201080029790.6.
Communication dated Apr. 16, 2015 from the European Patent Office in counterpart European Application No. 10804419.9.

* cited by examiner

US 9,084,371 B2

WIRING SUBSTRATE AND MANUFACTURING METHOD FOR WIRING SUBSTRATE

CROSS REFERENCE TO RELATED APPLICATIONS

This application is a National Stage of International Application No. PCT/JP2010/062638 filed July. 27, 2010, claiming priority based on Japanese Patent Application Nos. 2009-174505 and 2009-174506, filed Jul. 27, 2009 and 2009-276165, filed Dec. 4, 2011, the contents of all of which are incorporated herein by reference in their entirety.

TECHNICAL FIELD

The present invention relates to a wiring substrate suitable for use in an electronic device in electric and hybrid vehicles and a method for manufacturing the wiring substrate.

BACKGROUND ART

A wiring substrate adapted for a large electric current, such as a control substrate for a high-output motor mounted in an electric or hybrid vehicle, is used in combination with a bus bar to allow a large electric current to flow, as disclosed in Patent Document 1. Also, Patent Document 2 discloses a method for manufacturing a circuit substrate by arranging a conductor plate, in which a large electric current is to flow, between molding dies and then supplying resin into the dies.

PRIOR ART DOCUMENT

Patent Document

Patent Document 1: Japanese Laid-Open Patent Publication No. 2003-249288
Patent Document 2: Japanese Laid-Open Patent Publication No. 8-181417

SUMMARY OF THE INVENTION

Problems that the Invention is to Solve

However, a surface-mounted component cannot be mounted in accordance with the inventions described in Patent Documents 1 and 2.

Accordingly, it is an objective of the present invention to provide a wiring substrate that is adapted for a large electric current and allows surface mounting of a component, and a method for manufacturing the wiring substrate.

Means for Solving the Problems

To achieve the foregoing objective and in accordance with a first aspect of the present invention, a wiring substrate including a wiring pattern and a base material is provided. The wiring pattern is formed using a metal plate and fixed to the base material. The wiring pattern has a mounting pad for surface-mounting a component.

According to the present invention, a component is surface-mounted on a wiring pattern that is formed using a metal plate adapted for a large electric current.

The metal plate defined herein refers to a plate-like metal body having such a thickness that the metal body can be punched out and maintain its shape without receiving external force, that is, not a metal foil that cannot maintain its shape autonomously.

In the above the wiring substrate according to the present invention, component mounting surfaces of a plurality of mounting pads for mounting a single component may be flush with each other.

In this case, the component is mounted without becoming slanted.

In the above the wiring substrate according to the present invention, the wiring pattern may have a first pattern portion and a second pattern portion that are formed using one metal plate as an integral body connected together through a joint portion. The joint portion may be cut off after the first pattern portion and the second pattern portion are fixed to the base material, and the mounting pads may be formed in the first pattern portion and the second pattern portion.

In this case, the mounting pads corresponding to one component are formed integrally with each other using the same metal plate. The component mounting surfaces of the mounting pads are thus arranged flush with each other easily.

In the above the wiring substrate according to the present invention, the joint portion may be cut off in a pressing step.

In this case, the joint portion is cut off through pressing. Accordingly, a plurality of joint portions may be cut off simultaneously.

In the above the wiring substrate according to the present invention, the wiring pattern may includes a first wiring pattern fixed to one surface of the base material, and a second wiring pattern fixed to another surface of the base material. The first wiring pattern may have a cut portion formed by cutting off the joint portion. In planar projection of the wiring substrate, an end portion of the second wiring pattern located closest to the cut portion of the first wiring pattern may be arranged at a position that does not overlap the position of the cut portion in the first wiring pattern.

In this case, a creepage distance is ensured between the cut portion of the first wiring pattern and the end portion of the second wiring pattern.

In the above the wiring substrate according to the present invention, the base material may have an insertion hole arranged at a position overlapping the position of the joint portion.

In this case, an insertion hole for passing a punching tool for cutting off the joint portion is formed in the base material in advance. This prevents the tool from interfering with the base material and a cut piece from the wiring pattern is prevented from being adhered to the base material.

In the above the wiring substrate according to the present invention, a holding joint portion may be provided between a portion of the wiring pattern and another portion of the wiring pattern, and the holding joint portion may be cut off after the wiring pattern is fixed to the base material.

In this case, a pattern having a shape that can be modified easily even by small external force, such as an elongated pattern, is allowed to maintain its shape until the pattern is fixed to the base material.

In the above the wiring substrate according to the present invention, the wiring pattern may includes a front side wiring pattern fixed to a front surface of the base material, and a back side wiring pattern fixed to a back surface of the base material. The back side wiring pattern may have a pattern projection including a top portion located at a position corresponding to a front surface of the front side wiring pattern. The front side wiring pattern may have an opening for receiving the pattern projection. The mounting pads may be provided on the front side wiring pattern and the top portion of the pattern projection.

In this case, the component is mounted directly on the wiring patterns that are arranged on opposite sides of the base material.

In the above the wiring substrate according to the present invention, an outermost surface of the wiring substrate may be a surface of the wiring substrate that is other than the mounting pads, located equally or more outward from the mounting pads, and a flat zone having the largest surface area.

In this case, screen printing of solder can be carried out.

In the above the wiring substrate according to the present invention, the mounting pad may have a recess.

In this case, solder is prevented from leaking out of the mounting pads.

In the above the wiring substrate according to the present invention, a plate formed of the same material as the material of the wiring pattern may be fixed to the surface of the base material opposite to the surface to which the wiring pattern is fixed.

In this case, warpage is prevented in the wiring substrate.

In the above the wiring substrate according to the present invention, the wiring pattern may include a coil.

In this case, a coil of a transformer, for example, may be formed integrally in a wiring substrate adapted for a large electric current.

In accordance with a second aspect of the present invention, a method for manufacturing a wiring substrate having a base material, a first pattern portion, and a second pattern portion is provided. The first and second pattern portions are fixed to the base material and formed using metal plates. The method includes: a first step for forming mounting pads for surface-mounting a component in each of the first and second pattern portions that are connected together through a joint portion; a second step for fixing the first and second pattern portions to the base material; and a third step for cutting off the joint portion.

According to the present invention, a wiring substrate is provided that is adapted for a large electric current and allows surface mounting of a component.

In the above the method for manufacturing a wiring substrate according to the present invention, the joint portion may be cut off through pressing in the third step.

In this case, a plurality of joint portions may be cut off simultaneously.

In the above the method for manufacturing a wiring substrate according to the present invention, a holding joint portion may be formed between a portion of the pattern portion and another portion of the pattern portion in the first step, and the holding joint portion may be cut off in the third step.

In this case, the holding joint portion is cut off simultaneously with press cutting of the joint portion.

Effects of the Invention

Accordingly, the present invention provides a wiring substrate that is adapted for a large electric current and allows surface mounting of a component, and a method for manufacturing the wiring substrate.

BRIEF DESCRIPTION OF THE DRAWINGS

FIG. 9(A2) is a plan view showing the wiring substrate illustrated in FIG. 9(A1);
FIG. 9(B1) is a cross-sectional view showing the heat sink;
FIG. 9(B2) is a plan view showing the heat sink.

DETAILED DESCRIPTION OF THE PREFERRED EMBODIMENTS

First Embodiment

A wiring substrate according to a first embodiment of the present invention will now be described with reference to the attached drawings.

Figure 1A:
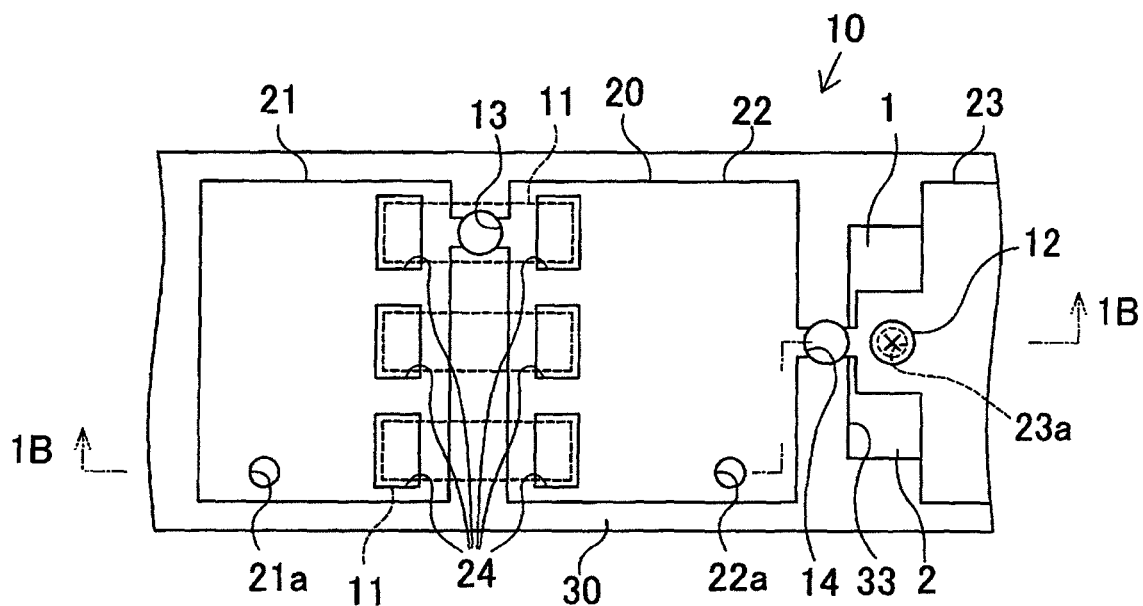
FIG. 1(A) is a plan view showing a wiring substrate according to a first embodiment of the present invention.
Figure 1B:
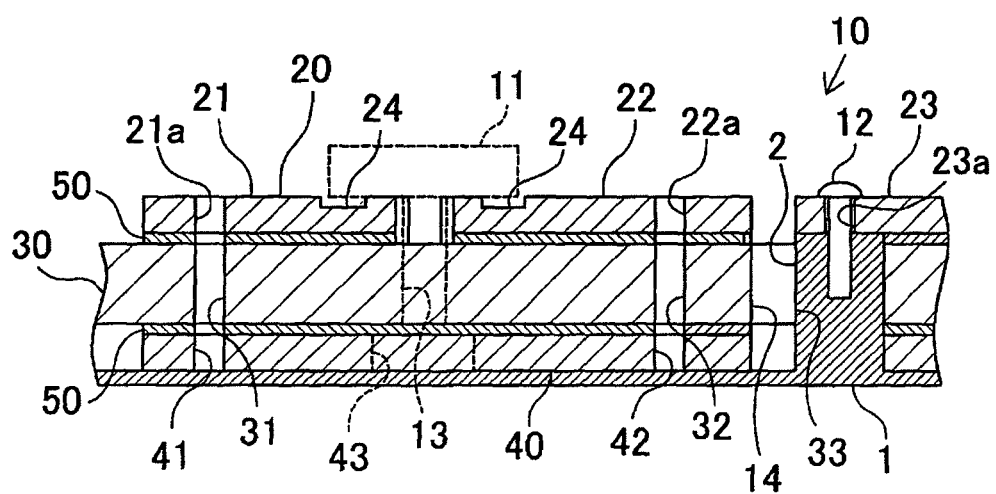
FIG. 1(B) is a cross-sectional view taken along line 1B-1B of FIG. 1(A)

A wiring substrate 10 according to the first embodiment is, for example, a power substrate, which allows flow of a large electric current, used in an electric vehicle or a hybrid vehicle. The wiring substrate 10 is fixed to a casing 1 through a non-illustrated insulating heat dissipating sheet. As illustrated in FIGS. 1(A), 1(B) and 1(C), in the wiring substrate 10, a front side wiring pattern 20 serving as a plate-like first wiring pattern and a back side wiring pattern 40 serving as a second wiring pattern are fixed to the top surface and the lower surface, respectively, of an insulation layer 30 serving as a base material using adhesive 50.

The front side wiring pattern 20 and the back side wiring pattern 40 are each formed by punching a copper plate with a thickness of, for example, 0.4 to 2.0 mm, or, more preferably, 0.5 to 1.0 mm, using a press in accordance with a predetermined pattern. In the first embodiment, a copper plate with a predetermined thickness is employed as material for a wiring pattern adapted for a large electric current (for example, 50 to 180 A). Specifically, the copper plate herein refers to a plate-like copper body having such a thickness that the copper body can be punched out and is capable of maintaining its shape without receiving external force, not a copper foil that cannot maintain its shape autonomously. However, the material for forming each wiring pattern 20, 40 is not restricted to a copper plate but may be conductive material such as an aluminum plate.

The front side wiring pattern 20 and the back side wiring pattern 40 of the first embodiment may correspond to one example of a wiring pattern as set forth in the claims.

The front side wiring pattern 20 includes a first pattern portion 21, a second pattern portion 22, and a third pattern portion 23, each of which is formed in accordance with a corresponding predetermined pattern. The first to third pattern portions 21 to 23 are fixed to the top surface of the insulation layer 30 through the adhesive 50, without being electrically connected to one another.

The first pattern portion 21 and the second pattern portion 22 each include a predetermined number of recesses 24 each serving as a mounting pad. Solder is provided in each of the recesses 24 and used to surface-mount an electronic component 11, which serves as a component, on the first pattern portion 21 and the second pattern portion 22 at a position between the first and second pattern portions 21, 22.

Figure 1:
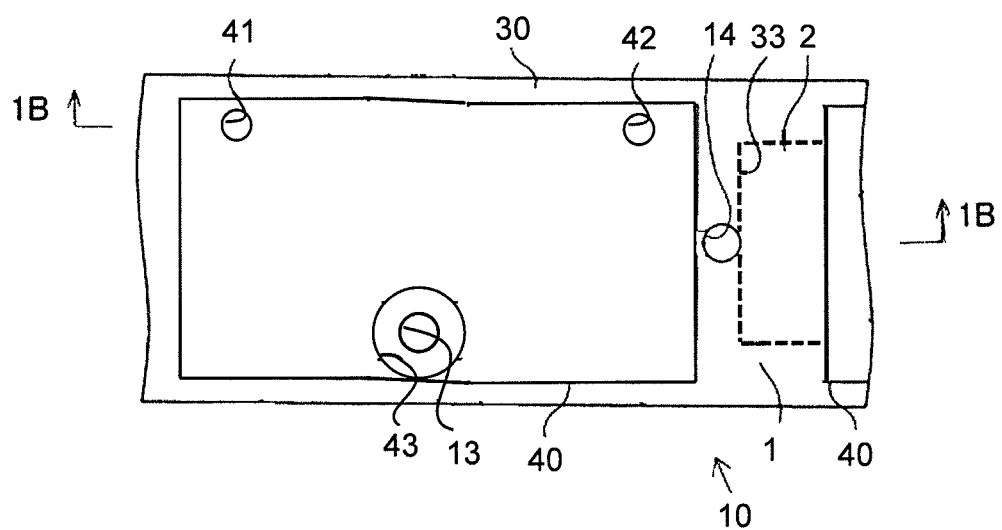
FIG. 1(C) is a plan view showing a second wiring pattern to the present invention.

In FIG. 1, a portion of each electronic component 11 is indicated with broken lines for illustrative purposes.

The third pattern portion 23 has a through hole 23*a*. A screw 12 is passed through the through hole 23*a* to fasten the third pattern portion 23 to a projection 2 of the casing 1, which is received in an opening 33 formed in the insulation layer 30, through a non-illustrated insulating sheet or the like.

The front side wiring pattern 20 may be fixed to the casing 1 without the insulation layer 30 in the above-described manner. Since the front side wiring pattern 20 has a great thickness as has been described, the front side wiring pattern 20 is strong compared to a wiring pattern formed using a copper foil. This allows the front side wiring pattern 20 to be fixed to the casing 1.

The back side wiring pattern 40 is fixed to the lower surface of the insulation layer 30 through the adhesive 50. Using non-illustrated penetration patterns connected to the back side wiring pattern, interlayer electrical connection is achieved for the back side wiring pattern 40 in portions corresponding to predetermined electrical connection positions in the front side wiring pattern 20.

The insulation layer 30 is formed by curing a prepreg prepared by immersing a core of glass fiber cloth or the like in resin such as epoxy resin. The thickness of the insulation layer 30 is set to, for example, 0.3 to 4.0 mm and, more preferably, 0.3 to 0.8 mm.

As the adhesive 50, a silicone based adhesive is employed with its adhesion performance, heat transmission performance, insulation performance, and elasticity taken into consideration. The thickness of the adhesive 50 is set to 100 pm or smaller and, more preferably, 40 to 50 μm. Specifically, the adhesive 50 is not restricted to a silicone based type but an epoxy based adhesive, for example, may be selected due to its improved adhesive strength. Alternatively, a glass-fiber-free prepreg may be used for the adhesive.

Figure 2A:
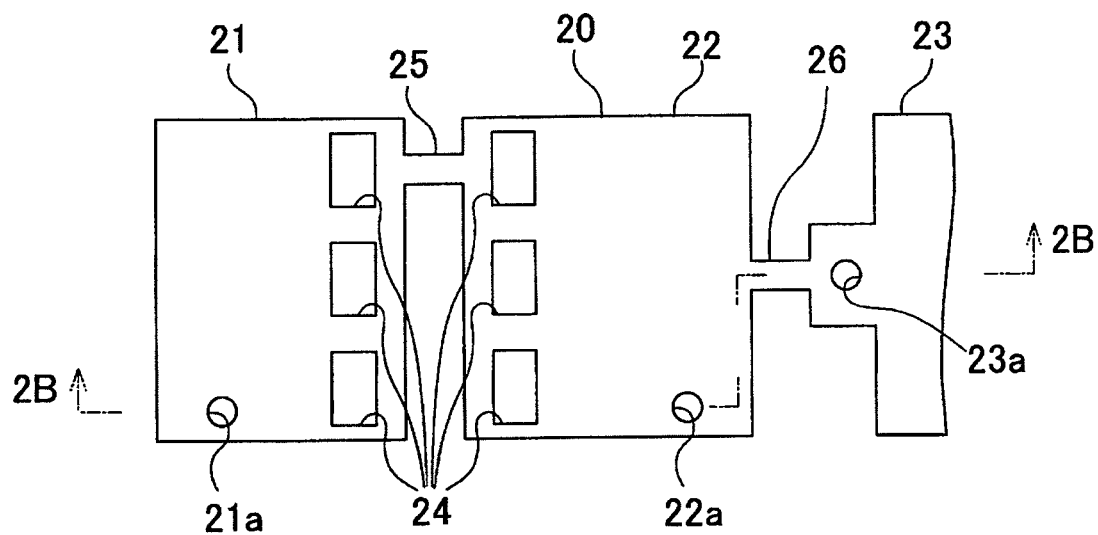
FIG. 2 is a view illustrating a part of a manufacturing step for the wiring substrate of the first embodiment.
Figure 2B:
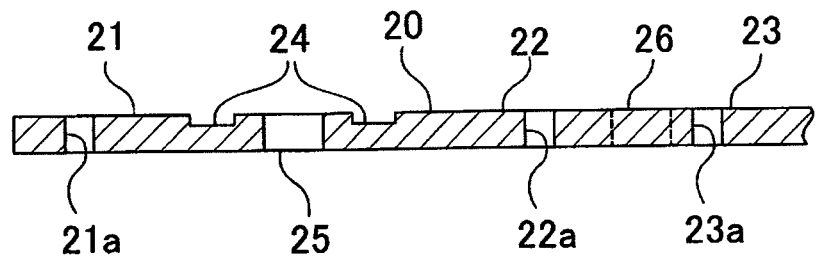

Steps for manufacturing the wiring substrate 10, which has the above-described configuration, will now be described. FIG. 2(A) is a plan view showing the front side wiring pattern 20 having the pattern portions 21 to 23 that are connected together. FIG. 2(B) is a cross-sectional view taken along line 2B-2B of FIG. 2(A).

First, as illustrated in FIGS. 2(A) and 2(B), a copper plate having a predetermined shape is prepared as material and pressed to shape the front side wiring pattern 20 including the first and second pattern portions 21, 22 each having the recesses 24 and the third pattern portion 23 having the through holes 23*a* in accordance with a predetermined pattern. At this stage, the first pattern portion 21 and the second pattern portion 22 are connected to each other through a joint portion 25. The second pattern portion 22 and the third pattern portion 23 are connected together through a joint portion 26. When projected onto the lower surface of the insulation layer 30, each of the joint portions 25, 26 is arranged at a position that does not correspond to the back side wiring pattern 40, such as a position in the opening 43 of the back side wiring pattern 40. The step of shaping the pattern portions 21 to 23 in the state connected together through the joint portions 25, 26 and forming the recesses 24 in the first pattern portion 21 and the second pattern portion 22 corresponds to one example of the first step set forth in the claims. Even if shaping of the first and second pattern portions 21, 22 and formation of the recesses 24 are not performed simultaneously in a step, as in a case where the recesses 24 are formed after the first pattern portion 21 and the second pattern portion 22 are molded in a state connected together through the joint portion 25, the step corresponds one example of the first step.

The front side wiring pattern 20 and the back side wiring pattern 40, as will be described later, are shaped through pressing for the following reason. That is, when a wiring pattern is deposited on an insulation layer, the dimension of the wiring pattern in the width direction perpendicular to the thickness direction becomes greater toward the insulation layer for a reason related to the manufacturing step. Alternatively, if a wiring pattern is etched on a copper plate arranged on an insulation layer, the dimension of the wiring pattern in the width direction perpendicular to the thickness direction becomes smaller toward the insulation layer for a reason related to the manufacturing step. However, when the wiring patterns 20, 40 are formed through pressing, the dimension of each of the wiring patterns 20, 40 in the width direction becomes uniform along the thickness direction.

The first pattern portion 21 and the second pattern portion 22 have a positioning through hole 21*a* and a positioning through hole 22*a*, respectively. The step illustrated in FIGS. 2(A) and 2(B) corresponds to one example of the first step set forth in the claims. The joint portion 25 and the joint portion 26 each correspond to one example of the joint portion" set forth in the claims.

Figure 3A:
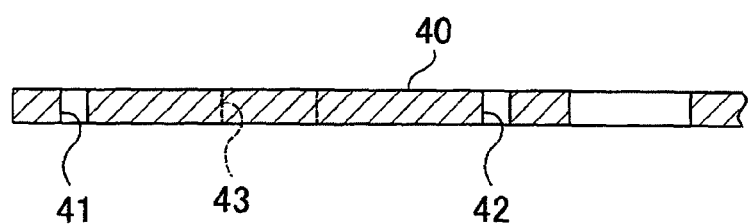
FIG. 3 is a view illustrating a part of a manufacturing step for the wiring substrate of the first embodiment.

Then, as illustrated in FIG. 3(A), a copper plate having a predetermined shape is prepared as material and pressed to shape the back side wiring pattern 40 having a positioning through hole 41 and a positioning though hole 42, which correspond to the through hole 21*a* and the through hole 22*a* of the front side wiring pattern 20, respectively, and the opening 43 in accordance with the predetermined pattern.

Figure 3B:
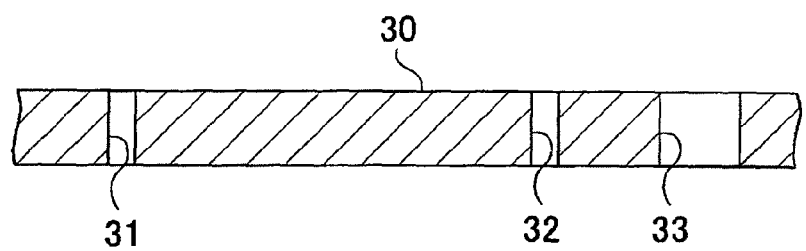

Subsequently, with reference to FIG. 3(B), after curing a prepreg prepared by immersing a core of glass fiber cloth or the like in resin such as epoxy resin, the insulation layer 30 is formed to have a positioning through hole 31 corresponding to the through holes 21a, 41, a positioning through hole 32 corresponding to the through holes 22a, 42, and the opening 33.

Figure 3C:
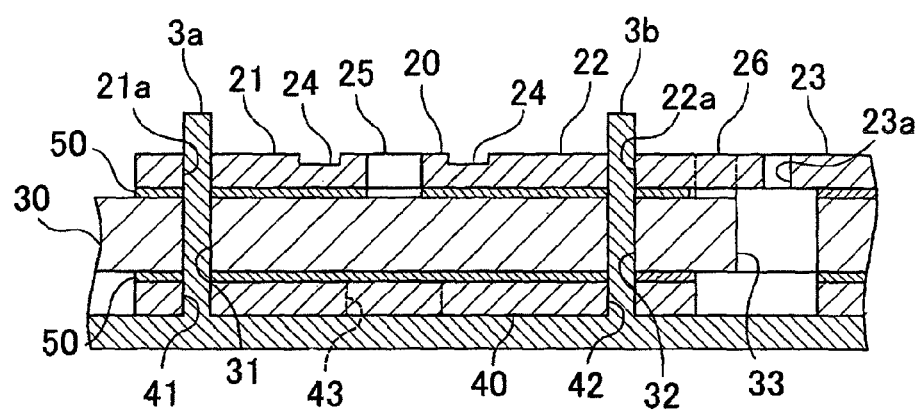

Next, as shown in FIG. 3(C), with the adhesive 50 applied onto the wiring patterns 20, 40, a positioning pin 3a is passed sequentially through the through hole 41, the through hole 31, and the through hole 21a in this order and a positioning pin 3b is passed sequentially through the through hole 42, the through hole 32, and the through hole 22a in this order. This determines the positions of the wiring patterns 20, 40 and the insulation layer 30 relative to one another. In this state, the joint portion 25 connects the first pattern portion 21 to the second pattern portion 22 and the joint portion 26 connects the second pattern portion 22 to the third pattern portion 23. As a result, the relative positions of the pattern portions 21 to 23, which configure the front side wiring pattern 20, are also fixed. Afterwards, the adhesive 50 is cured to fix the wiring patterns 20, 40 to the insulation layer 30. The step of fixing the front side wiring pattern 20 and the back side wiring pattern 40 to the insulation layer 30 corresponds to one example of the second step set forth in the claims.

Figure 3D:
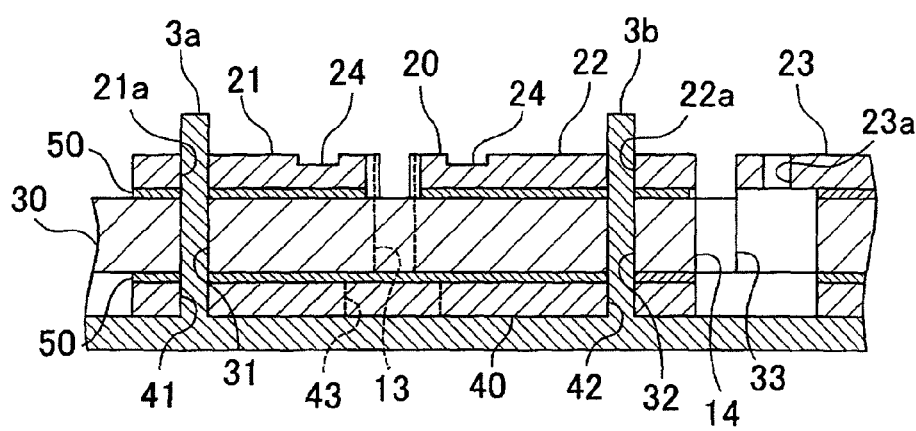

Then, with reference to FIG. 3(D), in a single manufacturing step using progressive pressing, the pattern portions 21 to 23 are separately formed from one another by removing the joint portions 25, 26, and the insulation layer 30 is divided into independent pieces each including the corresponding one of the pattern portions 21 to 23. In the first embodiment, using a first press die in the progressive pressing, a through hole 13 for cutting off the joint portion 25 and a through hole for cutting off the joint portion 26 are formed in the front side wiring pattern 20 and the insulation layer 30. This separates the pattern portions 21 to 23 from one another. Then, using subsequent dies, the insulation layer 30 is divided into independent pieces as has been described, and the wiring substrate 10 is completed. Afterwards, the electronic component 11 is surface mounted on the wiring substrate 10 and the wiring substrate 10 is fixed to the casing 1 using the screw 12. The step of removing the joint portions 25, 26 corresponds to one example of the third step set forth in the claims.

The adhesive 50 does not necessarily have to be applied onto the wiring patterns 20, 40 but may be used on the insulation layer 30. Alternatively, the adhesive 50 may be replaced by an adhesive sheet. The front side wiring pattern 20 and the back side wiring pattern 40 are electrically connected together at the predetermined electrical connection positions using the penetration pattern, which penetrates a non-illustrated opening for electrical connection formed in the insulation layer 30, after the wiring patterns 20, 40 are fixed to the insulation layer 30. However, the invention is not restricted to this. That is, for example, the front side wiring pattern 20 and the back side wiring pattern 40 may be electrically connected to each other at the time when the wiring patterns 20, 40 are positioned.

As has been described, in the wiring substrate 10 and the method for manufacturing the wiring substrate 10 according to the first embodiment, the wiring substrate 10 is configured by fixing the front side wiring pattern 20 and the back side wiring pattern 40 to the insulation layer 30 using the adhesive 50. As a result, the invention achieves formation of a wiring pattern on an insulation layer without employing a method such as deposition or etching.

Also, in the wiring substrate 10 and the method for manufacturing the wiring substrate 10 according to the first embodiment, the wiring patterns 20, 40 are formed through pressing. This provides a pattern having a great thickness and a width that is uniform along the thickness direction.

In the wiring substrate 10 and the method for manufacturing the wiring substrate 10 according to the first embodiment, the adhesive 50 is a silicone based adhesive and has improved elasticity compared to other adhesives. This prevents peeling of the adhesive 50 and damage to the wiring patterns 20, 40 even when the wiring patterns 20, 40 are deformed by residual stress after molding.

In the wiring substrate 10 and the method for manufacturing the wiring substrate 10 according to the first embodiment, the recesses 24 are formed in the first pattern portion 21 and the second pattern portion 22 of the front side wiring pattern 20 at the positions at which the electronic components 11 are mounted. After cream solder is supplied into the recesses 24 and the electronic components 11 are mounted in the recesses 24, the pattern portions 21, 22 are electrically connected to the electronic components 11 in a reflow process. The solder is thus prevented from leaking out of the recesses 24, making it unnecessary to form a stopper on the wiring patterns.

Since the recesses 24 are filled with solder, the component mounting surface of each electronic component 11 is a flat surface at the height of the corresponding recess 24, which is flush with the front surface of the first pattern portion 21 and the front surface of the second pattern portion 22. The first pattern portion 21 and the second pattern portion 22 are shaped in a state connected together through the joint portion 25 by punching out the same copper plate. As a result, the component mounting surfaces are arranged on one plane.

Further, the recesses 24 each serving as a mounting pad are arranged in the first pattern portion 21 and the second pattern portion 22. Accordingly, the front surfaces of the first pattern portion 21 and the second pattern portion 22 are arranged outward to the recesses 24 serving as the mounting pads and form a flat zone with a maximum surface area, which is an outermost surface of the wiring substrate 10. This allows screen printing of solder on the wiring substrate 10 even after formation of the recesses 24.

In the wiring substrate 10 and the method for manufacturing the wiring substrate 10 according to the first embodiment, the front side wiring pattern 20, the back side wiring pattern 40, and the insulation layer 30 have the through holes 21a, 22a, the through holes 41, 42, and the through holes 31, 32, respectively, to position the wiring patterns 20, 40 and the insulation layer 30 relative to one another at the time of fixation of the wiring patterns 20, 40 and the insulation layer 30. The positioning pin 3a is passed through the through holes 21a, 41 and the through hole and the positioning pin 3b is inserted through the through holes 22a, 42 and the through hole 32. In this state, the wiring patterns 20, 40 are fixed to the insulation layer 30 using the adhesive 50. In this manner, the wiring patterns 20, 40 and the insulation layer 30 are positioned relative to one another by passing positioning members, which are the positioning pins 3a, 3b, through the corresponding through holes.

In the method for manufacturing the wiring substrate 10 according to the first embodiment, in the step illustrated in FIG. 2(A), the first pattern portion 21 and the second pattern portion 22 connected together through the joint portion 25 and the second pattern portion 22 and the third pattern portion 23 connected to each other through the joint portion 26 are formed. In the step shown in FIG. 3(D), the joint portions 25, 26 are removed after the pattern portions 21 to 23 are fixed to the insulation layer 30 through the adhesive 50. As a result, even though the pattern portions 21 to 23 are not electrically connected together, the pattern portions 21 to 32 are positioned with respect to the insulation layer 30 without being displaced relative to one another.

In the method for manufacturing the wiring substrate 10 according to the first embodiment, through the step shown in FIG. 3(D), removal of the joint portions 25, 25 and division of the insulation layer 30 into the independent pieces each having the corresponding pattern portion 21 to 23 are completed in one step.

Further, when projected onto the lower surface of the insulation layer 30, the joint portions 25, 26 are not overlapped with the back side wiring pattern 40 but spaced from the back side wiring pattern 40 at least by predetermined intervals. As a result, when the joint portions 25, 26 are cut off through punching to form the through holes 13, 14 to remove the corresponding joint portions 25, 26, the back side wiring pattern 40 is prevented from being punched out. Also, a predetermined distance is created between the portions to be cut in the joint portions 25, 26 and the back side wiring pattern 40. The distance is appropriately selected depending on voltage or the like, which ensures a necessary creepage distance.

In other words, a cut portion is formed in each of the first pattern portion 21 and the second pattern portion 22 after the joint portion 25 is removed. However, in a planar projection of the wiring substrate 10, the cut portion in each of the first and second pattern portions 21, 22 does not overlap with the end portion of the back side wiring pattern 40 that is closest to the cut portion. As a result, a creepage distance that can prevent a short circuit is set between the cut portion of each pattern portion 21, 22 and the end portion of the back side wiring pattern 40. Specifically, a portion of the front side wiring pattern 20 and a portion of the back side wiring pattern 40 may be overlapped with each other in planar projection as long as any cut portion of the front side wiring pattern 20 is not overlapped with the corresponding end portion of the back side wiring pattern 40 with the insulation layer 30 arranged between the cut portion and the end portion. If the back side wiring pattern 40 is configured by a plurality of pattern portions and joint portions like the front side wiring pattern 20, the joint portions of the back side wiring pattern 40 may be removed simultaneously through punching for forming the through holes 13, 14. In this case, a cut portion is formed around each of the through holes 13, 14 as an end portion of the back side wiring pattern 40. When projected onto the lower surface of the insulation layer 30, the cut portion must be arranged at such a position that the cut portion is overlapped with neither the cut portions in the first and second pattern portions 21, 22 nor the cut portions in the second and third pattern portions 22, 23. As a result, even if the back side wiring pattern 40 has multiple pattern portions that are joined together through corresponding joint portions, a creepage distance necessary for insulation is obtained.

In a first modification of the first embodiment, a core material having enhanced heat transmission performance compared to a resin layer typically used as an insulation layer, such as a core material that is partially and entirely formed of metal, and adhesive with high insulation performance may be employed as the insulation layer 30 and the adhesive 50. This makes it unnecessary for core material used as base material to have insulation performance, a member with high heat transmission performance may be used as the core material. In this case, heat produced by the wiring substrate 10 is released to the exterior through the core material. The core material corresponds to one example of the base material set forth in the claims.

In a second modification of the first embodiment, the insulation layer 30 and the adhesive 50 may be replaced by a member having adhesion performance. This makes it unnecessary to employ adhesive.

Figure 4:
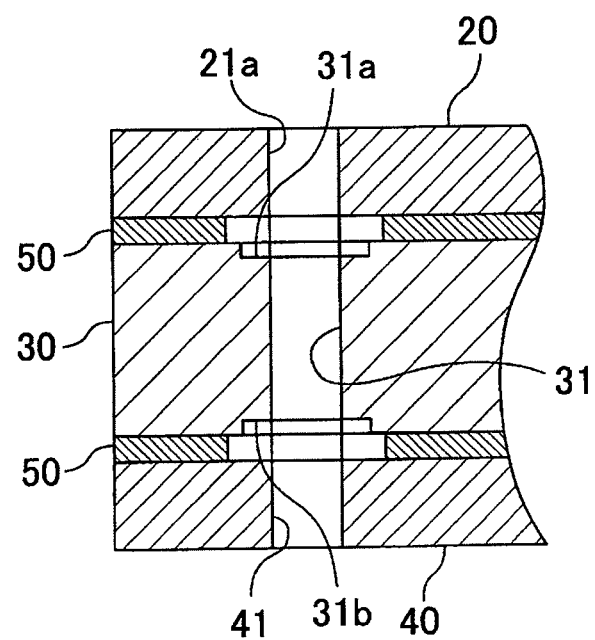
FIG. 4 is an enlarged cross-sectional view showing a main portion of a third modification of the first embodiment.

As illustrated in FIG. 4, in a third example of the first embodiment, annular steps 31a, 31b may be formed at opposite ends of the positioning through hole 31 in the insulation layer 30. In this configuration, when the adhesive 50 in the vicinity of the through hole 31 is pressed by the wiring patterns 20, 40, the adhesive 50 flows into the spaces formed by the steps 31a, 31b and is prevented from flowing directly into the through hole 31. If annular or rectangular steps are formed at the ends of the through hole 32 or the ends of the positioning through hole of each wiring pattern 20, 40, a similar advantage is obtained.

In a fourth modification of the first embodiment, each recess 24 may be replaced by an annular projection that projects in an annular shape from the outer periphery of the zone corresponding to the recess 24. The annular projection prevents leakage of solder.

Alternatively, instead of forming the recesses 24, solder resist may be applied onto the front surface of the wiring substrate 10 except for the component mounting portions, thus preventing leakage of solder. Particularly, if solder resist having a different color from the color of the solder, such as green solder resist, is used, the shape of the solder is accurately detected in an image inspection.

Figure 5A:
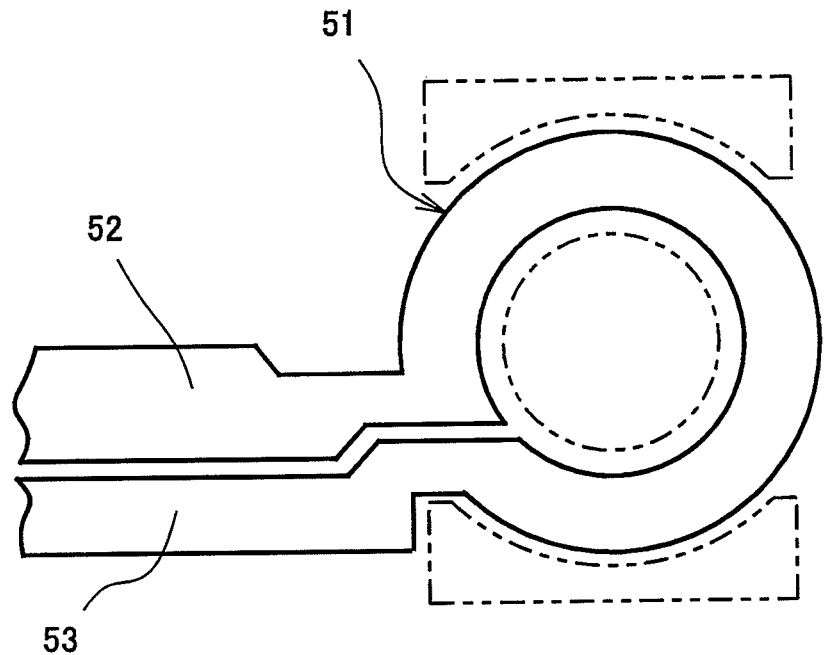
FIG. 5(A) is a plan view showing a first coil according to a fifth modification of the first embodiment.
Figure 5B:
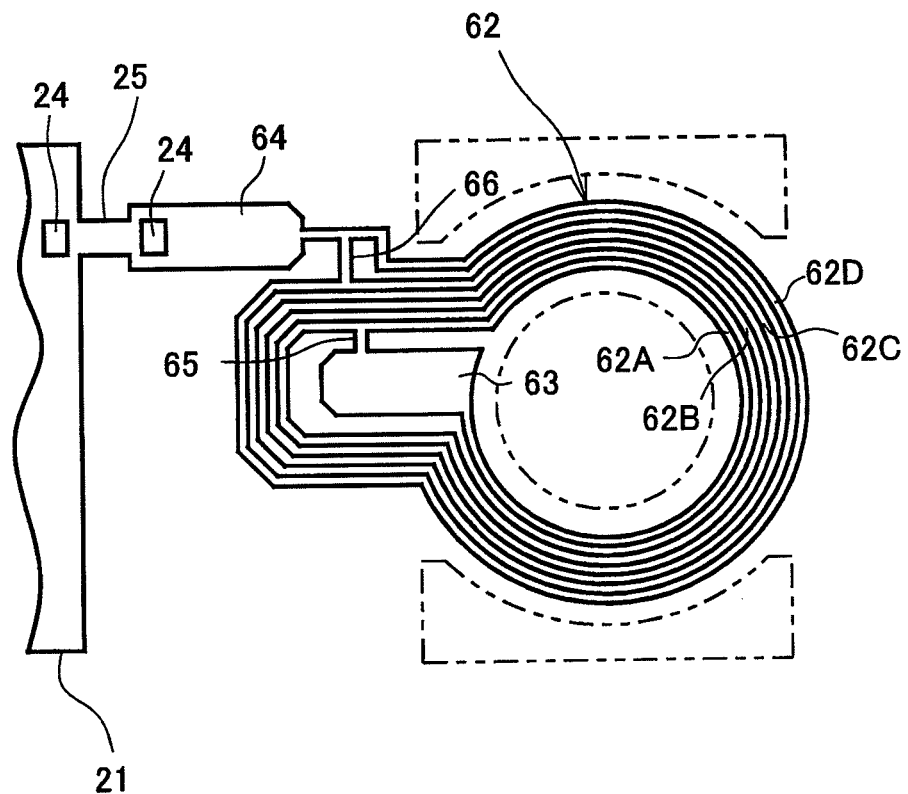
FIG. 5(B) is a plan view showing a second coil according to the fifth modification of the first embodiment.

In a fifth modification of the first embodiment, referring to FIGS. 5(A) and 5(B), the back side wiring pattern 40 may be a flat plate-like first coil 51 and the second pattern portion 22 may be a second coil 62, which has a flat shape.

The first coil 51 and the second coil 62 form a portion of a transformer. In the transformer, a coil member including the two coils 51, 62 insulated from each other is clamped by two cores (represented by the double dotted chain lines in FIGS. 5(A) and 5(B)) from above and below. The transformer thus brings about a transforming function, or, specifically, transforms voltage input from an input terminal and outputs the transformed voltage from an output terminal. Each of the cores is arranged in a central portion and peripheral portions of the corresponding one of the coils 51, 62.

The number of windings of the first coil 51 is one and the first coil 51 is fixed to the lower surface of the insulation layer 30 as the base material.

With reference to FIG. 5(A), a first end portion 52 and a second end portion 53 formed in the first coil 51 configure an input terminal.

The second coil 62 is a flat plate-like coil of which the number of winding is four. Specifically, a first winding portion 62A, a second winding portion 62B, a third winding portion 62C, and a fourth winding portion 62D are arranged coaxially from inside to outside. The first winding portion 62A is connected to a first end portion 63 serving as a terminal and the fourth winding portion 62D is connected to a second end portion 64. The first end portion 63 and the second end portion 64 correspond to terminals of the second coil 62.

The first coil 51 is shaped through pressing such that the number of winding of the first coil 51 is one.

At a stage after a front side wiring pattern including the second coil 62 is shaped through pressing, the first pattern portion 21 and the second coil 62 are connected together through the joint portion 25.

The first end portion 63 of the second coil 62 is shaped in a state connected to the second winding portion 62B, which is adjacent to the first end portion 63, through a holding joint portion 65. The second end portion 64 is shaped in a state connected to the third winding portion 62C, which is adjacent to the second end portion 64, through a holding joint portion 66.

Accordingly, the first end portion 63 and the second end portion 64 correspond to a portion of the wiring pattern and the second winding portion 62B and the third winding portion 62C correspond to another portion of the wiring pattern. The recesses 24 each serving as a mounting pad are formed in the second end portion 64 through pressing.

The two coils 51, 62 are fixed to the insulation layer 30 by curing the adhesive 50.

The step of fixing the second coil 62 to the insulation layer 30 corresponds to one example of the second step set forth in the claims.

After the first coil 51 and the second coil 62 are fixed to the insulation layer 30, the holding joint portions 65, 66 for the coils 51, 62 are cut off through pressing.

The joint portion 25 for connecting the first pattern portion 21 to the second coil 62 is cut off simultaneously with the holding joint portions 65, 66. As a result, the wiring substrate 10 including the first coil 51 and the second coil 62 in the wiring pattern is completed.

The step of cutting off the joint portion 25 and the holding joint portions 65, 66 corresponds to one example of a third step as set forth in the claims.

After the joint portion 25 and the holding joint portions 65, 66 are cur off, cream solder is supplied into the recesses 24 and the electronic components 11 (not shown) are mounted in the recesses 24. The first pattern portion 21 and the second coil 62 are thus electrically connected to each other through the electronic components 11.

Then, the cores are mounted with respect to the coil member, which is divided into independent pieces, from above and below, thus completing the transformer. When the transformer is mounted on a prescribed substrate, a transformer-equipped circuit substrate is completed.

In the fifth modification of the first embodiment, the joint portion 25, which connects the first pattern portion 21 and the second coil 62 together, is cut off simultaneously with the holding joint portions 65, 66 through pressing. This makes it unnecessary to have a step of cutting off the holding joint portions 65, 66 separately from a step of removing the joint portion 25.

The first end portion 63 of the second coil 62 is connected to the second winding portion 62B, which is adjacent to the first end portion 63, through the holding joint portion 65. The second end portion 64 is connected to the third winding portion 62C, which is adjacent to the second end portion 64, through the holding joint portion 66. As a result, the second coil 62, which has a greater number of windings, is mounted with respect to the insulation layer 30 without destabilizing the end portions 63, 64.

The wiring substrate 10, which is configured in the above-described manner, may be coated as a whole using an insulating resin. This not only improves insulation performance between the wiring patterns of the wiring substrate 10 but also enhances moisture resistance when certain coating materials are selected.

Second Embodiment

Figure 6A:
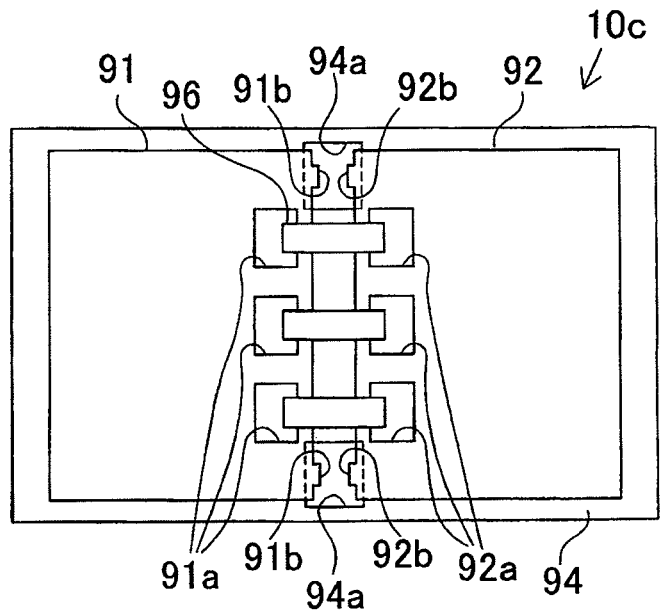
FIG. 6(A) is a plan view showing a wiring substrate according to a second embodiment of the present invention.
Figure 6B:
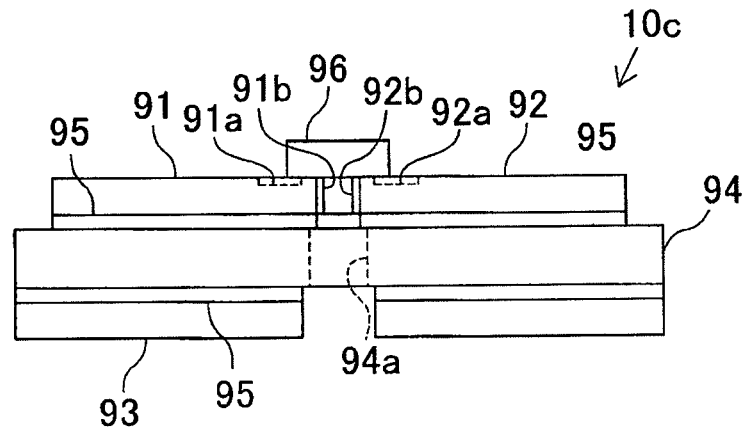
FIG. 6(B) is a side view showing the wiring substrate of the second embodiment.

A wiring substrate according to a second embodiment of the present invention and a method for manufacturing the wiring substrate will now be described with reference to FIGS. 6 and 7. FIG. 6(A) is a plan view showing a wiring substrate 10c of the second embodiment and FIG. 6(B) is a side view showing the wiring substrate 10c. FIG. 7 each illustrate a step of manufacturing the wiring substrate 10c of the second embodiment. Specifically, FIG. 7(A) shows a state immediately before punching and FIG. 7(B) shows a state immediately after the punching.

The wiring substrate 10c of the second embodiment includes a first pattern portion 91 and a second pattern portion 92, each of which is formed in a flat shape using a copper plate having a predetermined thickness. The first pattern portion 91 and the second pattern portion 92 are fixed to the top surface of an insulation layer 94 serving as a base material through adhesive 95 without being electrically connected to each other. The first pattern portion 91 and the second pattern portion 92 configure a first wiring pattern. The first pattern portion 91 and the second pattern portion 92 have a predetermined number of recesses 91a and a predetermined number of recesses 92a, respectively, each serving as a mounting pad. Solder is supplied into each of the recesses 91a, 92a and used to mount an electronic component 96 serving as a component at a position between the first pattern portion 91 and the second pattern portion 92. A back side wiring pattern 93 serving as a second wiring pattern is fixed to the lower surface of the insulation layer 94 using the adhesive 95. A non-illustrated penetration pattern ensures interlayer electrical connection for the back side wiring pattern 93 with respect to predetermined electrical connection positions in the pattern portions 91, 92.

Figure 7A:
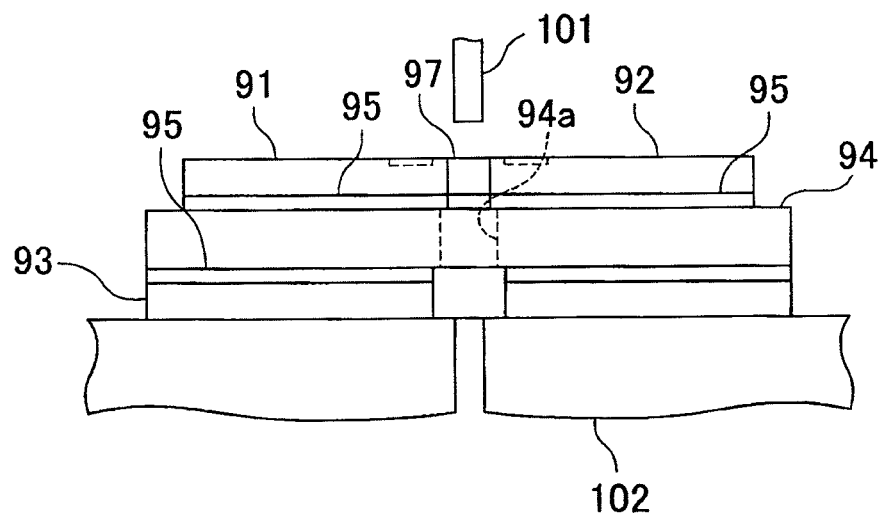
FIG. 7(A) is a view illustrating a state immediately before punching in a manufacturing step for the wiring substrate of the second embodiment.
Figure 7B:
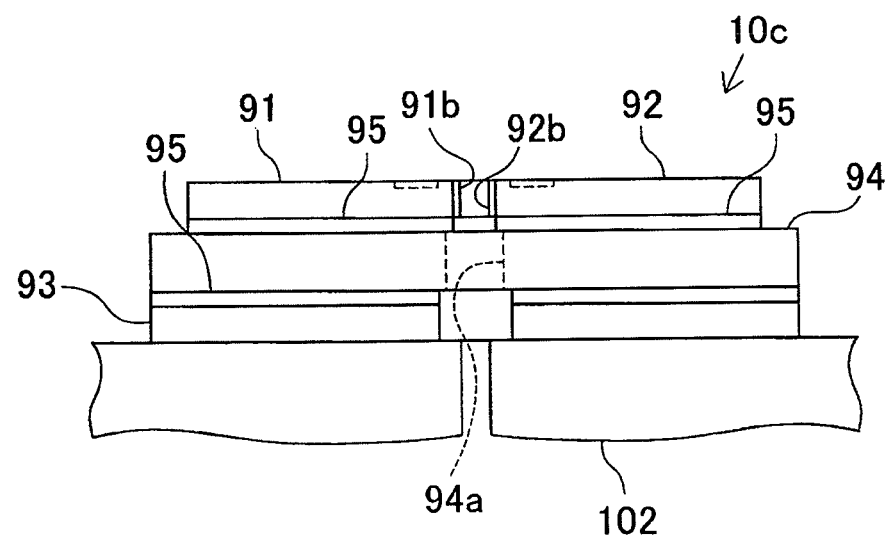
FIG. 7(B) is a view showing a state immediately after the punching in the manufacturing step of FIG. 7(A)

As illustrated in FIGS. 7(A) and 7(B), an insertion hole 94a is formed in the insulation layer 94 of the wiring substrate 10c of the second embodiment before the first pattern portion 91 and the second pattern portion 92 are fixed to the insulation layer 94.

The insertion hole 94a is formed in the insulation layer 94 to allow a punching tool 101 to pass through the insertion hole 94a without interfering with the insulation layer 94 at the time of progressive pressing or the like, which is performed to remove a joint portion 97.

The insertion hole 94a is formed in advance in the insulation layer 94 for the reason described below. Specifically, when the tool 101 passes through the insulation layer 94 after having removed the joint portion 97, there may be a disadvantageous case in which a cut piece from the joint portion 97 is adhered to an inner surface of the hole formed by the tool 101 passing through the insulation layer 94. The adhered cut piece may later fall in the product due to vibration, for example, thus causing a problem in a circuit such as a short circuit. Accordingly, in the second embodiment, the insertion hole 94a for passing the tool 101 is formed in advance in the insulation layer 94 to reliably prevent adhesion of such a cut piece.

In the method for manufacturing the wiring substrate 10c according to the second embodiment, the first pattern portion 91 and the second pattern portion 92 are formed in a state connected to each other through the joint portion 97. The first and second pattern portions 91, 92, which are connected together through the joint portion 97, are fixed to the top surface of the insulation layer 94 having the insertion hole 94a using the adhesive 95. Further, the back side wiring pattern 93, which has also been shaped through pressing, is fixed to the lower surface of the insulation layer 94 through the adhesive 95, which is applied onto the lower surface. Then, after the first and second pattern portions 91, 92, the insulation layer 94, and the back side wiring pattern 93 are mounted on a punching die 102 as illustrated in FIG. 7(A), the punching tool 101 is operated to cut off the joint portion 97. As a result, with reference to FIG. 7(B), the first pattern portion 91 and the second pattern portion 92, which have been connected through the joint portion 97, are disconnected from each other. In FIGS. 6 and 7, reference numeral 91b and reference number 92b refer to a cut portion in the first pattern portion 91 and a cut portion in the second pattern portion 92, respectively, which are formed through punching as has been described. The joint portion 97 corresponds to the joint portion set forth in the claims.

Figure 8A:
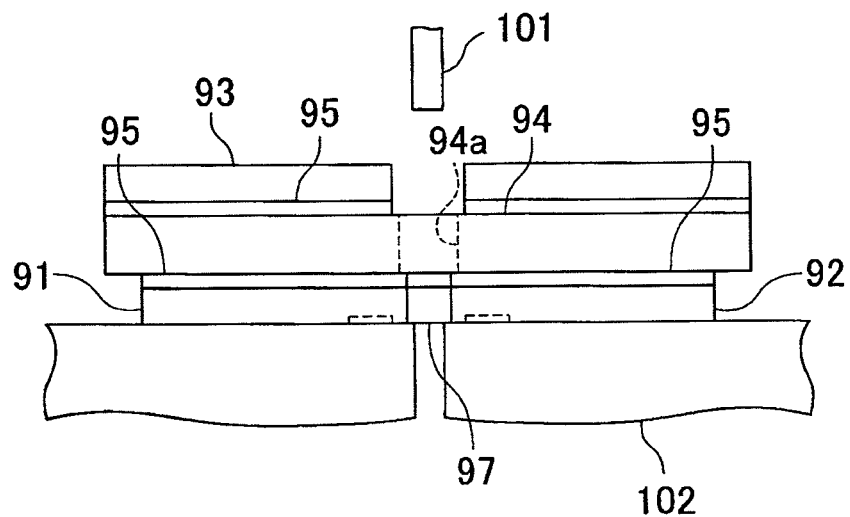
FIG. 8(A) is a view illustrating a state immediately before punching in a manufacturing step for a wiring substrate according to a modification of the second embodiment.
Figure 8B:
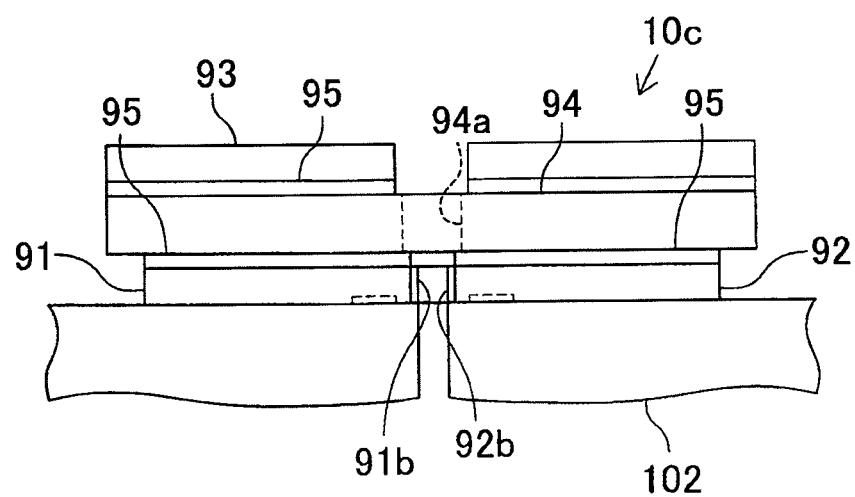
FIG. 8(B) is a view showing a state immediately after the punching in the manufacturing step of FIG. 8(A)

FIG. 8 illustrate a step of manufacturing the wiring substrate 10c of a modification of the second embodiment. Specifically, FIG. 8(A) shows a state immediately before punching and FIG. 8(B) shows a state immediately after the punching.

As illustrated in FIGS. 8(A) and 8(B), in a modification of the second embodiment, the above-described punching may be performed in a state in which the joint portion 97 is held close to the punching die 102. In this manner, the die 120 directly supports the proximities of the cut surfaces 91b, 92b (which are the cut portions in the joint portion 97), which are formed through the punching. This prevents shear droop in the cut portions of the joint portion 97.

The same advantage as the advantage of the second embodiment can be obtained in the first embodiment if an insertion hole for passing a punching tool at the time of removal of the joint portions 25, 26 through press punching is formed in advance in the insulation layer 30. Other embodiments and their modifications can also have the same advantage by forming a similar insertion hole. In these cases, the same advantage as the advantage of the modification of the second embodiment can be obtained by performing the above-described punching in a state in which the joint portions 25, 26 are held close to the punching die 102.

Third Embodiment

A wiring substrate and a method for manufacturing the wiring substrate according to a third embodiment of the present invention will hereafter be described.

Figure 9:
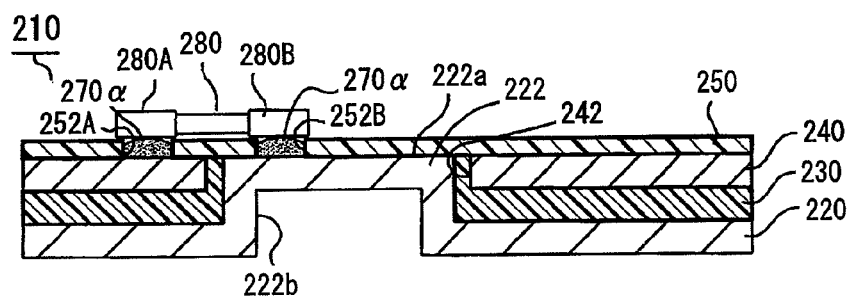
FIG. 9(A1) is a cross-sectional view showing a wiring substrate according to a third embodiment of the present invention in a state before a heat sink is mounted.
Figure 9:
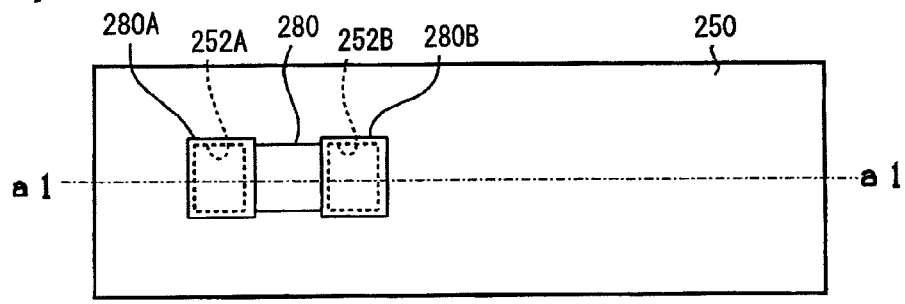
Figure 9:
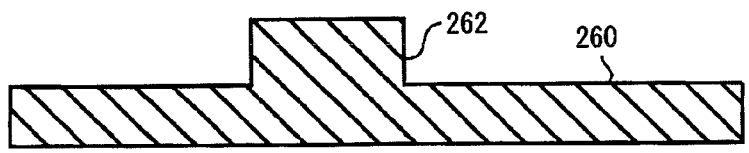
Figure 9:
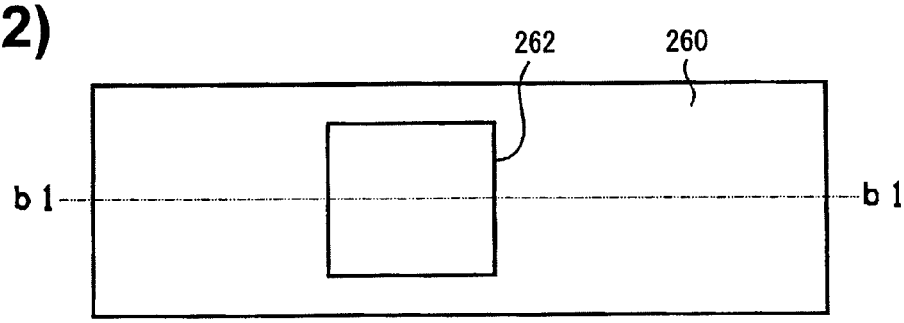
Figure 9C:
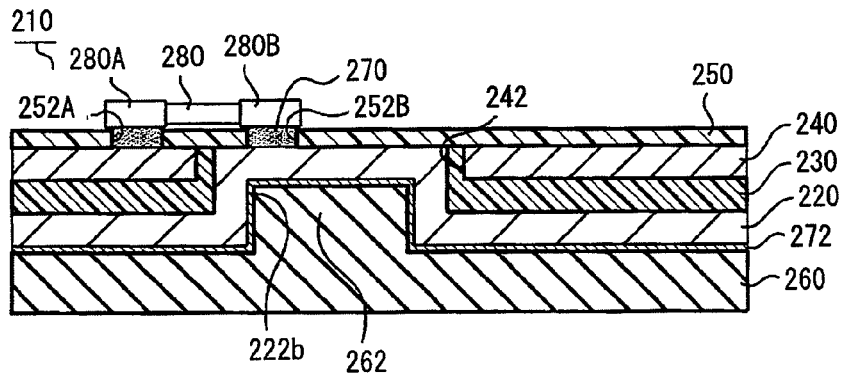
FIG. 9(C) is a cross-sectional view showing the wiring substrate of the third embodiment.

A wiring substrate 210 has a front side plate-like circuit pattern 240 at the front side and a back side plate-like circuit pattern 220 at the back side, which are layered together with a first resin layer 230 serving as a base material arranged between the front side plate-like circuit pattern 240 and the back side plate-like circuit pattern 220. A pattern projection 222 is formed in the back side plate-like circuit pattern 220. A top portion 222a of the pattern projection 222 is formed flush with the front surface of the front side plate-like circuit pattern 240 and the first resin layer 230 is arranged between the pattern projection 222 and the front side plate-like circuit pattern 240. The pattern projection 222 has a pattern recess 222b inside the pattern projection 222 (see FIG. 9(A1)). A heat sink 260 is attached to the lower surface of the back side plate-like circuit pattern 220 with a heat transmission sheet 272 arranged between the heat sink 260 and the back side plate-like circuit pattern 220. The heat sink 260 has a heat sink projection 262, which is received in the pattern recess 222b of the pattern projection 222 in the back side plate-like circuit pattern 220.

A second resin layer 250 having an opening 252A and an opening 252B is arranged on the front side plate-like circuit pattern 240 and the top portion 222a of the pattern projection 222. Solder 270 is supplied into the opening 252A of the second resin layer 250 to connect a terminal 280A of an electronic component 280 to the front side plate-like circuit pattern 240. The solder 270 is also arranged in the opening 252B of the second resin layer 250 to connect a terminal 280B of the electronic component 280 to the top portion 222a of the pattern projection 222. An electric current generated by the electronic component 280 mounted on the wiring substrate 210 flows to the back side plate-like circuit pattern 220 through the pattern projection 222. Also, heat produced by the electronic component 280 is transmitted to the heat sink 260 through the pattern projection 222. The electronic component 280 corresponds to the component according to the present invention and the terminals 280A, 280B each correspond to a connecting terminal. The electronic component 280 is, for example, a diode for controlling a large electric current. However, the component is not restricted to a component for controlling a large electric current as long as the component has a connecting terminal. The component may be a connecting component such as a jumper.

The front side plate-like circuit pattern 240 and the back side plate-like circuit pattern 220 are each formed by punching and pressing a copper plate having a thickness of 0.4 to 2 mm (preferably, 0.5 to 1.0 mm) in accordance with a certain pattern. Each circuit pattern 240, 220 includes a plurality of circuit pattern pieces combined. For example, the back side plate-like circuit pattern 220 has two punched circuit pattern pieces in combination. The pressing also shapes the pattern projection 222 in the back side plate-like circuit pattern 220. The third embodiment employs not a metal foil but a metal plate. The metal plate defined in the third embodiment refers to a plate-like metal body having such a thickness that the metal body can be punched out and is capable of maintaining its shape without receiving external force, not a metal foil that cannot maintain its shape autonomously. The first resin layer 230 serving as the base material is formed by curing a prepreg prepared by immersing a core of glass fiber cloth or the like in resin such as epoxy resin. The thickness of the first resin layer 230 is 0.3 to 4 mm. The second resin layer 250 is formed by curing a prepreg similar to that of the first resin layer 230 and has a thickness of 0.05 to 0.2 mm.

Figure 10A:
FIG. 10 is a view illustrating a manufacturing step for the wiring substrate of the third embodiment.
Figure 10B:
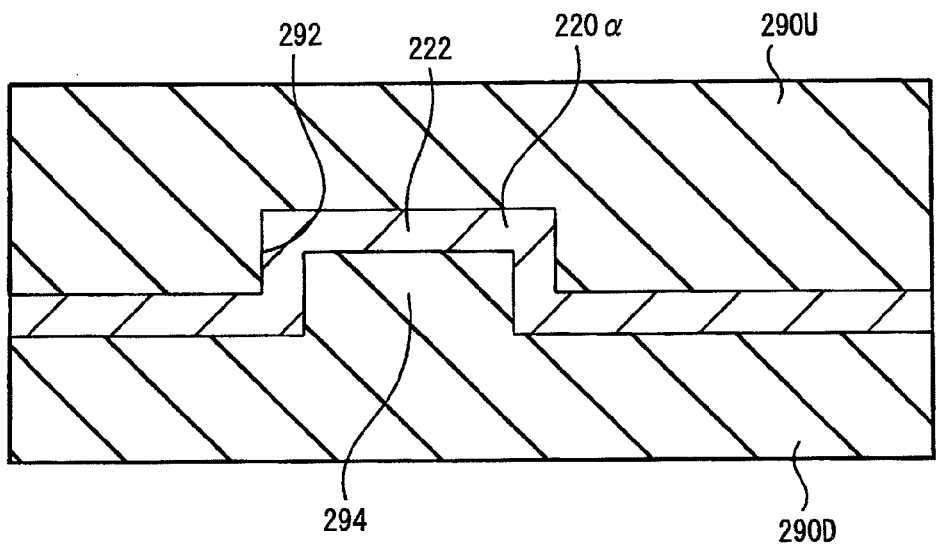
Figure 10C:
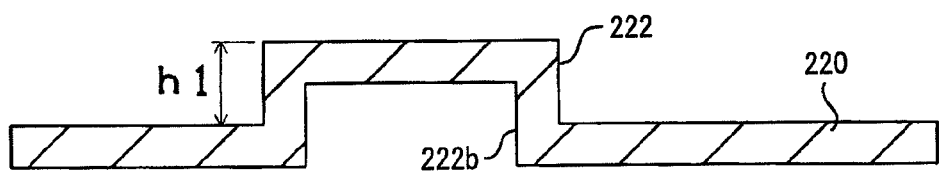
Figure 10D:
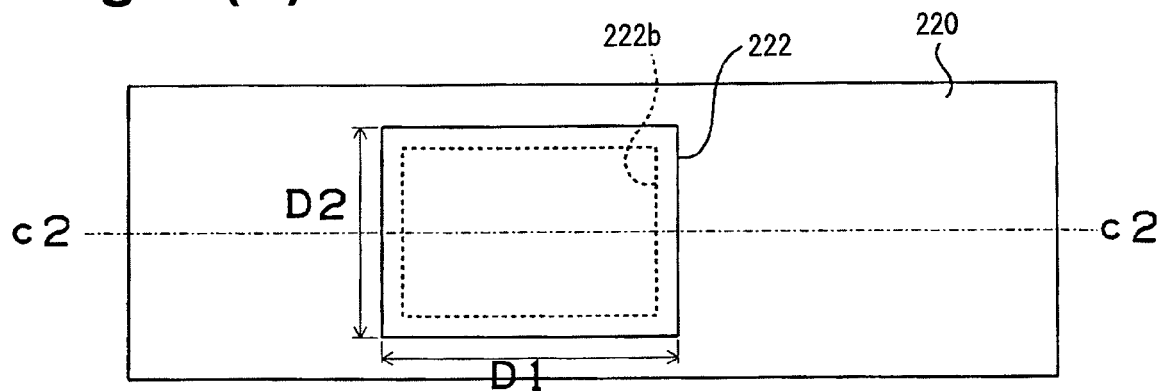

The steps of manufacturing the wiring substrate 210 of the third embodiment and a mounting substrate using the wiring substrate 210 will now be described with reference to FIGS. 10 to 13. A copper plate 220a having a thickness of 0.4 to 2 mm shown in FIG. 10(A) is pressed between an upper die 290U and a lower die 290D, as illustrated in FIG. 10(B). This causes a recess 292 in the upper die 290U and a projection 294 from the lower die 290D to shape the pattern projection 222 in the back side plate-like circuit pattern 220 and form a non-illustrated circuit pattern. FIG. 10(C) shows a cross section of the back side plate-like circuit pattern 220 after pressing and FIG. 10(D) is a plan view showing the back side plate-like circuit pattern 220. The cross section taken along line c2-c2 of FIG. 10(D) corresponds to FIG. 10(C). The longitudinal dimension D1 of the pattern projection 222 is 45 mm and the short side dimension D2 of the pattern projection 222 is 30 mm. The height h1 of the pattern projection 222 is determined in correspondence with the sum of the thickness of the first resin layer 230 and the thickness of the front side plate-like circuit pattern 240.

Figure 11:
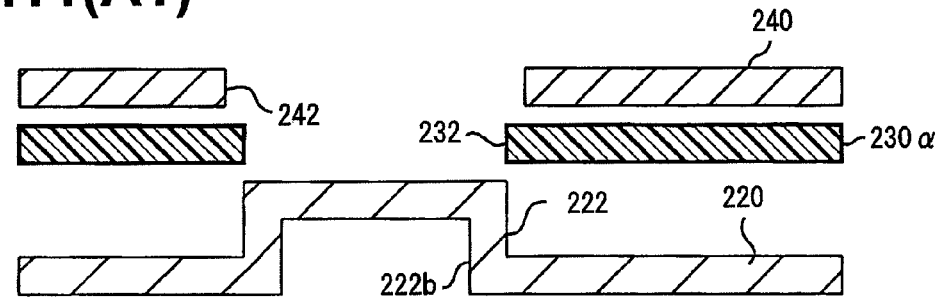
FIG. 11 is a view illustrating another manufacturing step for the wiring substrate of the third embodiment.
Figure 11:
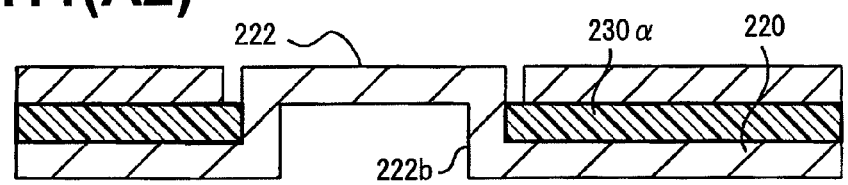
Figure 11:
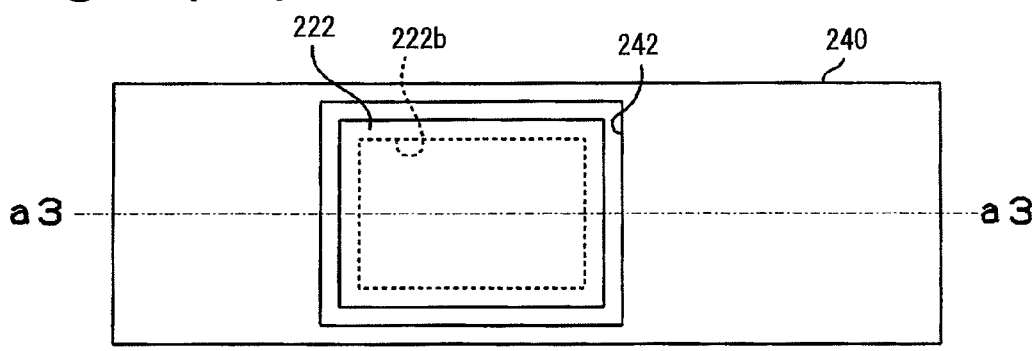
Figure 11:
Figure 11:
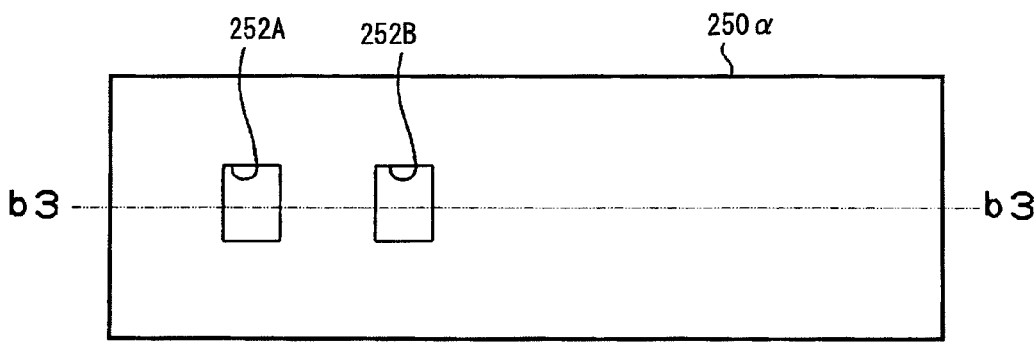

The back side plate-like circuit pattern 220, a prepreg 230α for forming the first resin layer, and the front side plate-like circuit pattern 240, which are shown in FIG. 11(A1), are layered as illustrated in FIG. 11(A2). The prepreg 230α for forming the first resin layer has an opening 232 corresponding to the pattern projection 222 of the back side plate-like circuit pattern 220. The front side plate-like circuit pattern 240 has an opening 242, which is formed in correspondence with the pattern projection 222 and receives the pattern projection 222. FIG. 11(A3) is a plan view showing the layered state and the cross section taken along line a3-a3 of FIG. 11(A3) corresponds to the cross section shown in FIG. 11(A2).

FIG. 11(B1) shows a cross section of a prepreg 250α for forming the second resin layer, which is layered on the layered body shown in FIG. 11(A2). FIG. 11(B2) is a plan view showing the prepreg 250α and the cross section taken along line b3-b3 of FIG. 11(B2) corresponds to FIG. 11(B1). The thickness of the prepreg 250α is 0.05 to 0.2 mm. Openings 252A, 252B are formed in the prepreg 250α at predetermined positions.

Figure 12:
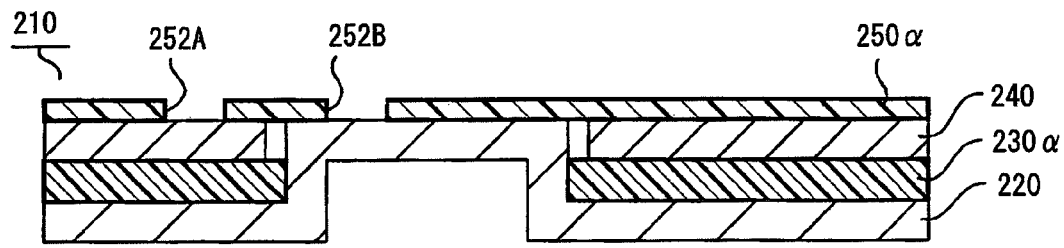
FIG. 12 is a view illustrating another manufacturing step for the wiring substrate of the third embodiment.
Figure 12:
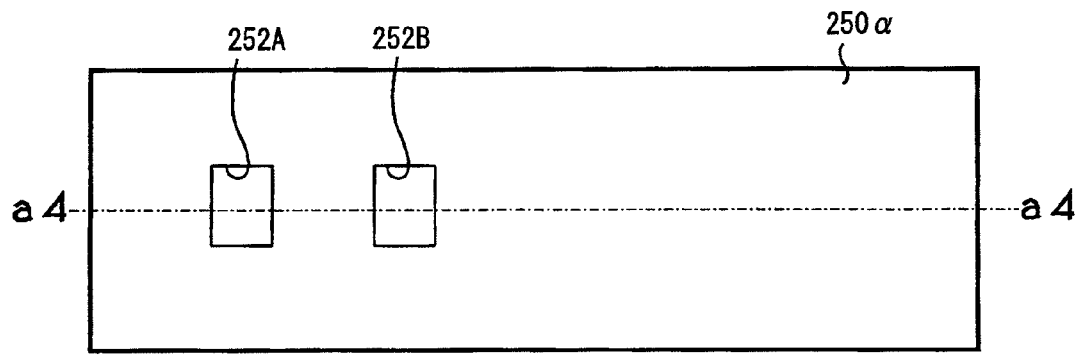
Figure 12:
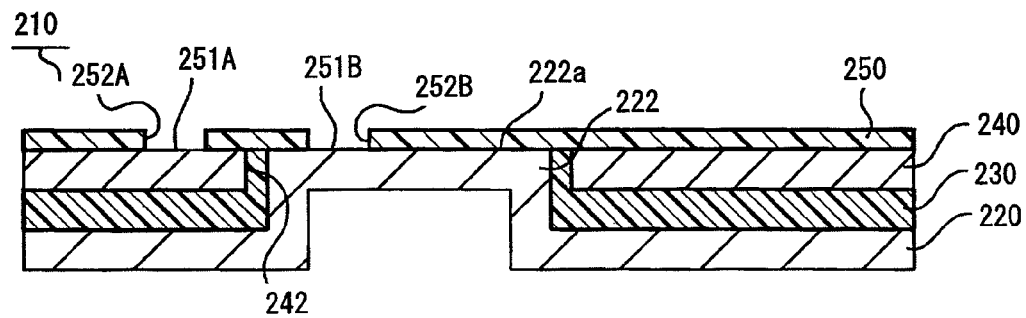
Figure 12:
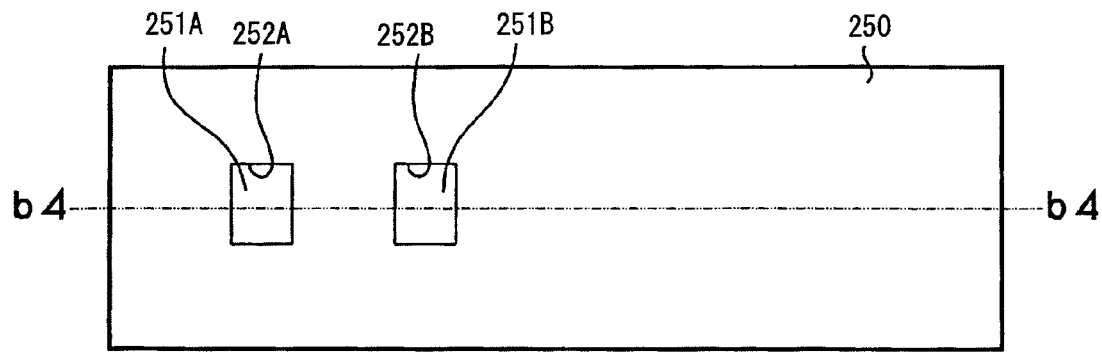

FIG. 12(A1) is a cross-sectional view showing a state in which the prepreg 250α is layered on the layered body illustrated in FIG. 11(A2). FIG. 12(A2) is a plan view showing the layered state. FIG. 12(A1) corresponds to the cross section taken along line a4-a4 of FIG. 12(A2).

The layered body is then pressed and heated to thermally cure the prepreg 230α, thus forming the first resin layer 230. The prepreg 250α is also thermally cured to form the second resin layer 250 (FIG. 12(B1) and FIG. 12(B2) are plan views and FIG. 12(B1) corresponds to the cross section taken along line b4-b4 of FIG. 12(B2)). The gap between the pattern projection 222 and the walls of the opening 242 of the front side plate-like circuit pattern 240 receives resin leaking from the prepreg 230α. A pad 251A is formed on the portion of the front side plate-like circuit pattern 240 exposed from the opening 252A of the second resin layer 250. A pad 251B is formed on the portion of the top portion 222a of the pattern projection 222 exposed from the opening 252B. As a result, the wiring substrate 210 is completed.

Subsequently, a metal mask (not shown) is arranged at the side corresponding to the front side plate-like circuit pattern 240 of the layered body of the wiring substrate 210.

Figure 13:
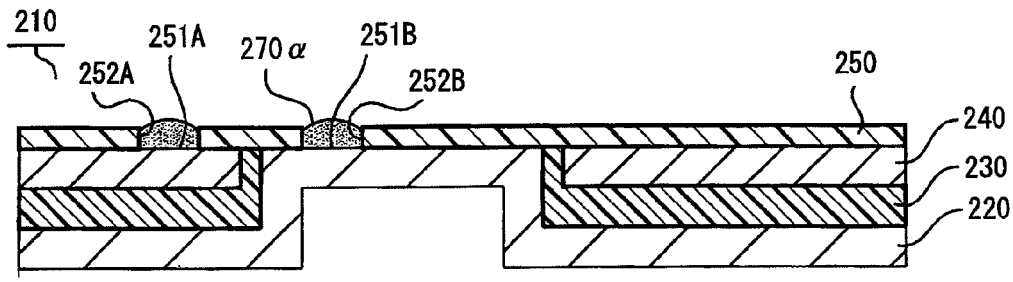
FIG. 13 is a view illustrating a manufacturing step of mounting an electronic component on the wiring substrate of the third embodiment.
Figure 13:
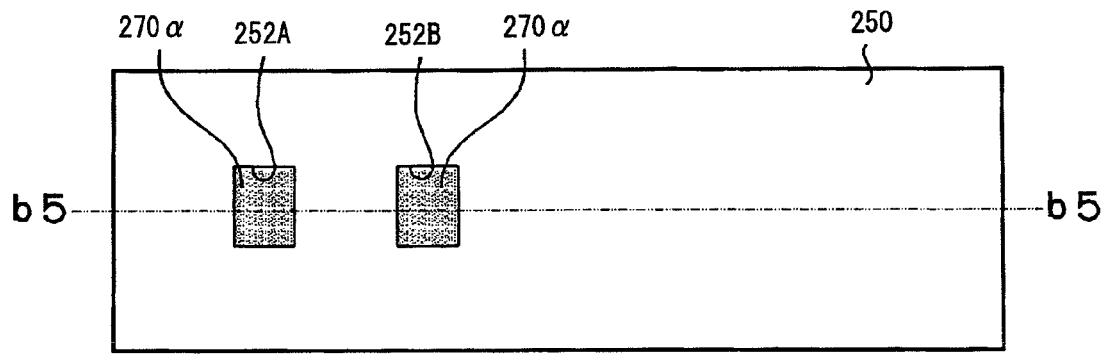
Figure 13:
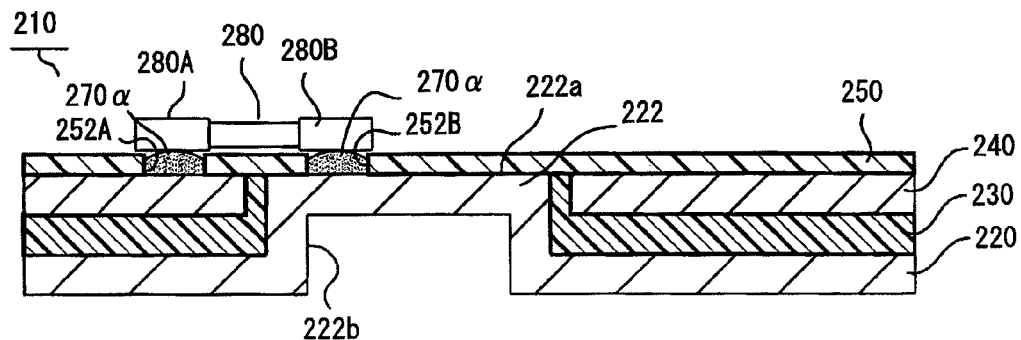
Figure 13:
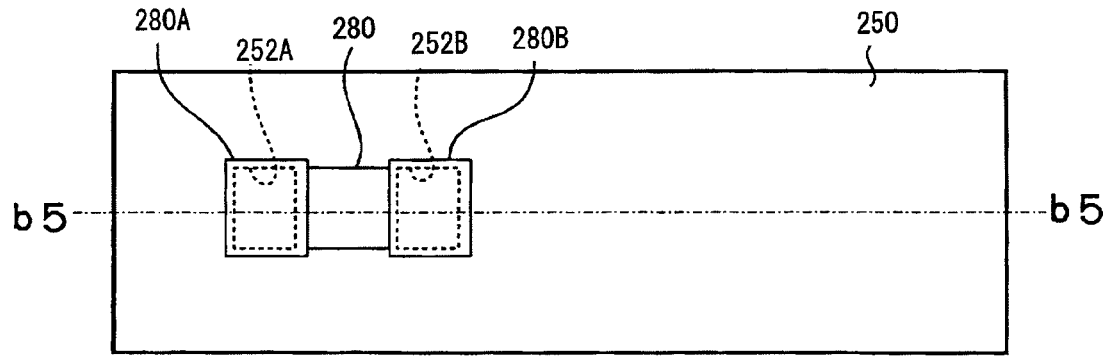

Cream solder 270α is then applied onto the pad 251A in the opening 252A and the pad 251B in the opening 252B of the second resin layer 250 (FIGS. 13(A1) and 13(A2) are plan views and FIG. 13(A1) corresponds to the cross section taken along line b5-b5 of FIG. 13(A2)). As the solder, Pb free solder made of Sn and one selected from the group consisting of Ag, Cu, In, Bi, and Zn is desirable.

In the third embodiment, instead of forming a solder resist layer on the front surface of the front side plate-like circuit pattern 240, the prepreg 250α is layered on the front side plate-like circuit pattern 240 to form the second resin layer 250 for solder application. Accordingly, simply by placing the prepreg 250α, the prepreg 250α is pressed and layered together with the prepreg 230α for forming the first resin layer 230. This makes it unnecessary to carry out a step of applying a solder resist layer.

Subsequently, the electronic component 280 for controlling a large electric current, such as a diode, is mounted such that the terminal 280A corresponds to the solder 270α in the opening 252A of the second resin layer 250 and the terminal 280B corresponds to the solder 270α in the opening 252B (FIGS. 13(B1) and 13(B2) are plan views and FIG. 13(B1) corresponds to the cross section taken along like b5-b5 of FIG. 13(B2)).

Reflow is then performed to mount the electronic component 280 on the front side plate-like circuit pattern 240 through the solder 270. In other words, the terminal 280A of the electronic component 280 is connected to the front side plate-like circuit pattern 240 and the terminal 280B is connected to the pattern projection 222 of the back side plate-like circuit pattern 220 (FIGS. 9(A1) and 9(A2) are plan views and correspond to the cross section taken along line a1-a1 of FIG. 9(A1)). The heat sink 260 coated with the heat transmission sheet 272 is attached to the back side plate-like circuit pattern 220 to allow the heat sink projection 262 of the heat sink 260 to be received in the pattern recess 222b of the pattern projection 222 illustrated in FIG. 9(A1).

In the wiring substrate 210 of the third embodiment, the pattern projection 222 is formed in the back side plate-like circuit pattern 220. The electronic component 280 is mounted by connecting the terminal 280A and the terminal 280B of the electronic component 280 to the front side plate-like circuit pattern 240 and the top portion 222a of the pattern projection 222, respectively. The heat sink 260 is arranged at the lower surface of the back side plate-like circuit pattern 220. In other words, the electronic component 280 is connected directly to both the front side plate-like circuit pattern 240 and the back side plate-like circuit pattern 220.

In the wiring substrate 210 of the third embodiment, the back side plate-like circuit pattern 220 is molded through pressing, together with the pattern projection 222. The heat produced by the electronic component 280 transmits to the heat sink 260 without passing through the first resin layer 230.

Fourth Embodiment

A wiring substrate according to a fourth embodiment of the present invention will hereafter be described with reference to the attached drawings.

Figure 14A:
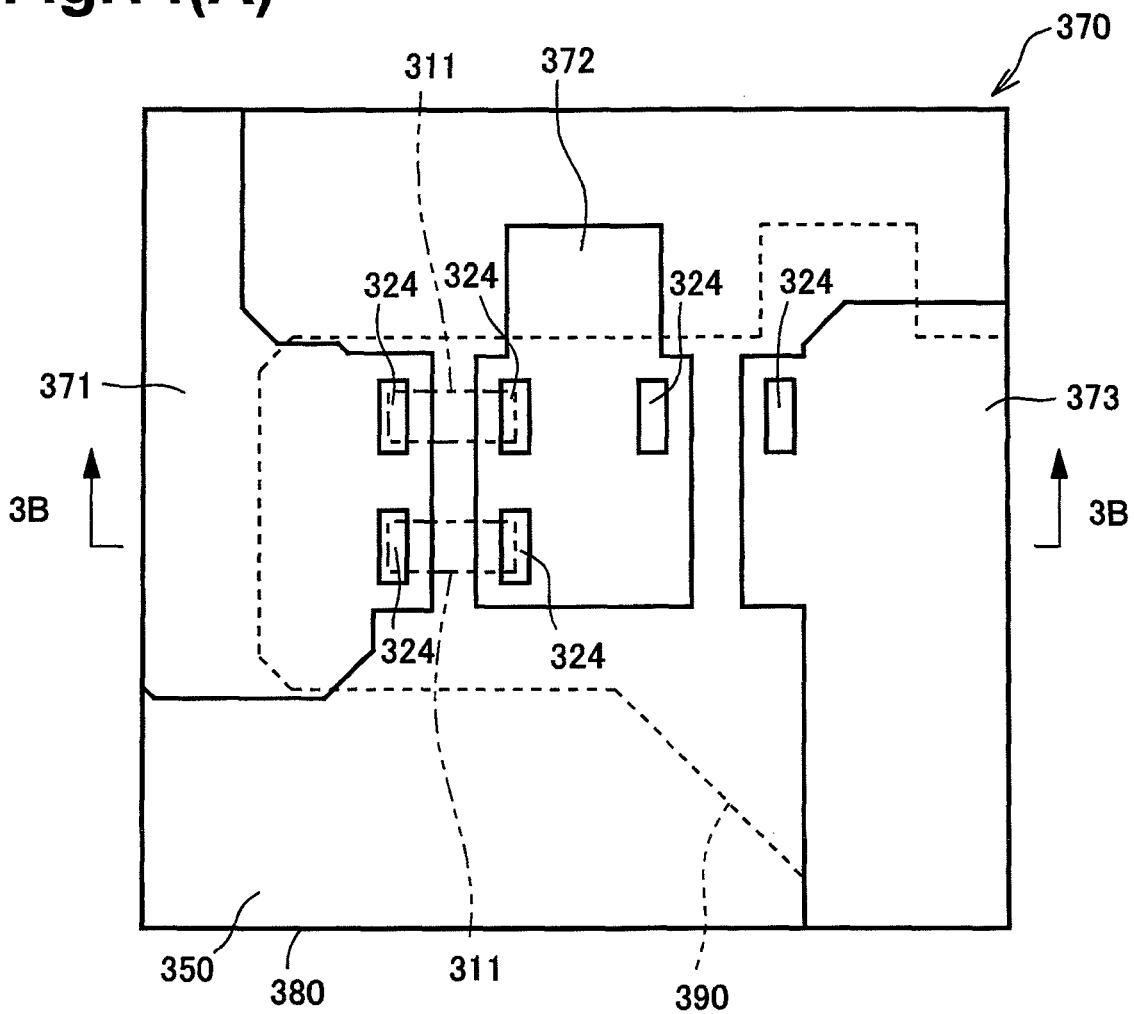
FIG. 14(A) is a front view showing a circuit substrate according to a fourth embodiment of the present invention.
Figure 14B:
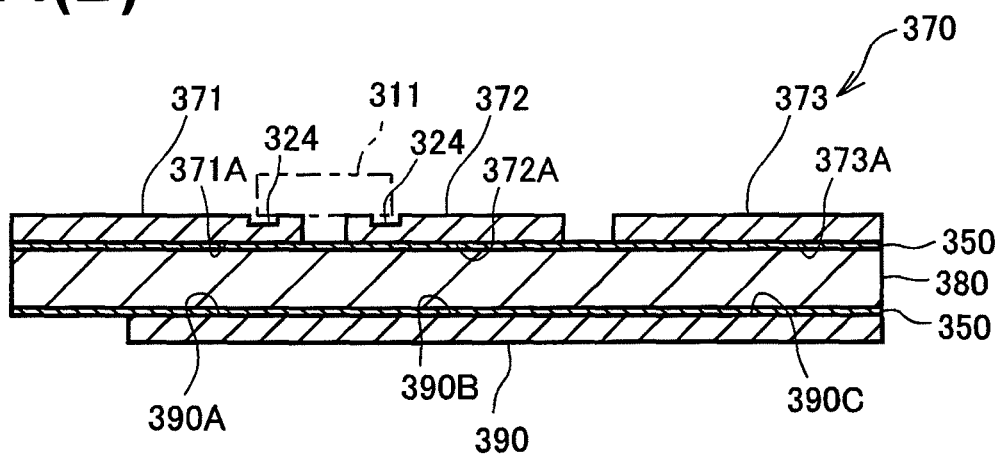
FIG. 14(B) is a cross-sectional view taken along line 3B-3B of FIG. 14(A)

As illustrated in FIG. 14(B), a circuit substrate 370 serving as a wiring substrate includes a plate-like first front side circuit pattern 371, a second front side circuit pattern 372, and a third front side circuit pattern 373, which are fixed to the top surface of an insulation layer 380 serving as a base material through an adhesive sheet serving as adhesive 350. With reference to FIG. 14(A), the first front side circuit pattern 371, the second front side circuit pattern 372, and the third front side circuit pattern 373 have different shapes. A single back side circuit pattern 390 is fixed to the lower surface of the insulation layer 380 through an adhesive sheet serving as the adhesive 350. The circuit substrate 370 is fixed to a casing (not shown) through an insulating heat dissipating sheet (not shown).

In the fourth embodiment, the front side circuit patterns 371 to 373 and the back side circuit pattern 390 are formed through press punching in accordance with a predetermined pattern. In the fourth embodiment, for each of the front side circuit patterns 371 to 373 and the back side circuit pattern 390, a metal plate having a predetermined thickness, not a metal foil, is used as a plate-like circuit pattern adapted for a large electric current (which is, for example, 50 to 180 A). The metal plate defined in the fourth embodiment is the same as the metal plate defined in the first embodiment. Each of the circuit patterns 371 to 373 and 390 does not necessarily have to be formed from a copper plate but may be formed using conductive material such as an aluminum plate. The front side circuit patterns 371 to 373 and the back side circuit pattern 390 of the fourth embodiment may each correspond to one example of the wiring pattern set forth in the claims. The first front side circuit pattern 371 corresponds to the first pattern portion and the second front side circuit pattern 372 corresponds to the second pattern portion.

A predetermined number of recesses 324 each serving as a mounting pad are formed in the first front side circuit pattern 371, the second front side circuit pattern 372, and the third front side circuit pattern 373. Solder is supplied into each of the recesses 324 to mount, for example, an electronic component 311 at a position between the first front side circuit pattern 371 and the second front side circuit pattern 372 on the circuit patterns 371, 372, as illustrated in FIGS. 14(A) and 14(B). In FIG. 14(A), an electronic component 311 mounted between the second front side circuit pattern 372 and the third front side circuit pattern 373 is not illustrated. The electronic component 311 is, for example, a diode for controlling a large electric current. However, the electronic component 311 is not restricted to a particular component for controlling a large electric current as long as the component includes a connecting terminal. The electronic component 311 thus may be a connection component such as a jumper.

In the fourth embodiment, any one of the front side circuit patterns 371 to 373 is not electrically connected to the back side circuit pattern 390. However, using a penetration pattern, interlayer electrical connection may be brought about in portions corresponding to predetermined electrical connection positions.

The insulation layer 380 serving as the base material is formed by curing a prepreg prepared by immersing a core of glass fiber cloth or the like in resin such as epoxy resin. The thickness of the insulation layer 380 is set to, for example, 0.3 to 4.0 mm and, more preferably, 0.3 to 0.8 mm. The insulation layer 380 functions to fix the circuit patterns 371 to 373 and 390 and improve rigidity of the circuit substrate 370.

As the main ingredient of the adhesive 350, epoxy resin is employed with its adhesion strength, heat transmission performance, insulation performance, and moisture resisting performance taken into consideration. Specifically, an adhesive sheet having a thickness of 100 μm or less or, more preferably, 40 to 50 μm is employed. In the fourth embodiment, the adhesive sheet is formed in a rectangular shape in correspondence with the shape of the insulation layer. The epoxy resin employed as the main ingredient of the adhesive 350 produces intense adhesive force compared to the epoxy resin used in the prepreg for the insulation layer 380. In the fourth embodiment, epoxy resin is selected as optimal for the main ingredient of the adhesive 350 since the epoxy resin exhibits high adhesive strength and improved performance in heat transmission, insulation, and moisture resistance. However, any other suitable resin may be employed as the adhesive 50 as long as the resin is adhesive.

Figure 15:
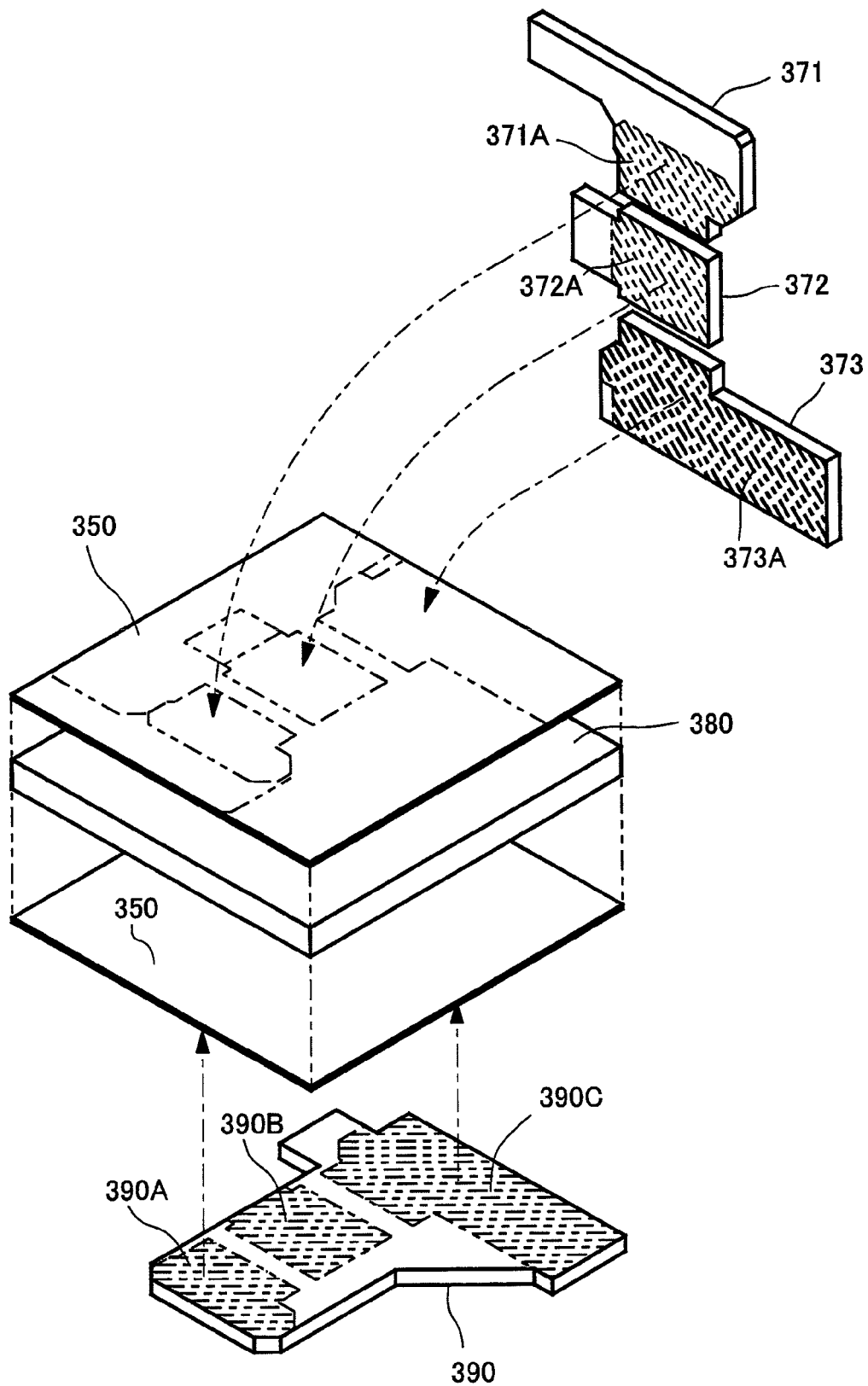
FIG. 15 is an exploded perspective view showing a circuit substrate according to a forth embodiment of the present invention.

The steps for manufacturing the circuit substrate 370, which has the above-described configuration, will hereafter be described. FIG. 15 is an exploded perspective view showing the circuit substrate 370. First, the first front side circuit pattern 371, the second front side circuit pattern 372, the third front side circuit pattern 373, and the back side circuit pattern 390, which are illustrated in FIG. 15, are each shaped using a copper plate having a predetermined shape, which is material for the patterns, through pressing. At this stage, the first front side circuit pattern 371, the second front side circuit pattern 372, and the third front side circuit pattern 373 are independent front side circuit patterns. To form the insulation layer 380, a prepreg is prepared by immersing a core of glass fiber cloth or the like in a second epoxy resin. The prepreg is then cured to obtain the insulation layer 380. The adhesive 350 is applied onto the top surface and the lower surface of the insulation layer 380.

Superimposed zones, where the front side circuit patterns 371 to 373 are overlapped with the back side circuit pattern 390 when the front side circuit patterns 371 to 373 at fixed positions on the insulation layer 380 are projected onto the back side circuit pattern 390, are set on the front side circuit patterns 371 to 373 and the back side circuit pattern 390. Each of the superimposed zones refers to a zone in which the corresponding one of the front side circuit patterns and the back side circuit pattern are superimposed on each other through the insulation layer 380 with respect to the direction of a plane defined by the circuit substrate 370. Adhesive force for fixing the circuit patterns is generated mainly in the superimposed zones.

As illustrated in FIG. 15, a first front side superimposed zone 371A, which is the superimposed zone defined through projection of the first front side circuit pattern 371 onto the back side circuit pattern 390, is set on the first front side circuit pattern 371. A second front side superimposed zone 372A, which is the superimposed zone defined through projection of the second front side circuit pattern 372 onto the back side circuit pattern 390, is set on the second front side circuit pattern 372. A third front side superimposed zone 373A, which is the superimposed zone defined through projection of the third front side circuit pattern 373 onto the back side circuit pattern 390, is set on the third front side circuit pattern 373.

Referring to FIG. 15, a back side first superimposed zone 390A, which is the superimposed zone defined through projection of the back side circuit pattern 390 onto the first front side circuit pattern 371, is set on the back side circuit pattern 390. The back side circuit pattern 390 also has a back side second superimposed zone 390B, which is the superimposed zone defined through projection of the back side circuit pattern 390 onto the second front side circuit pattern 372, and a back side third superimposed zone 390C, which is the superimposed zone defined through projection of the back side circuit pattern 390 onto the third front side circuit pattern 373. In FIG. 15, the front side circuit patterns 371 to 373 are illustrated as displaced at 90 degrees to extend perpendicular to a plane defined by the insulation layer 380 for illustrative purposes. Specifically, the circuit patterns 371 to 373 and 390 are shaped through pressing to reliably set the superimposed zones 371A, 372A, 373A, and 390A to 390C on the corresponding circuit patterns 371 to 373 and 390.

The first front side circuit pattern 371, the second front side circuit pattern 372, and the third front side circuit pattern 373 are mounted at corresponding fixing positions on the adhesive 350 applied onto the top surface of the insulation layer 380. The back side circuit pattern 390 is then arranged at a fixing position on the adhesive 350 applied onto the lower surface of the insulation layer 380.

Subsequently, the first front side circuit pattern 371, the second front side circuit pattern 372, the third front side circuit pattern 373, the insulation layer 380, and the back side circuit pattern 390 are pressed together from the side corresponding to the top surface of the insulation layer 380 and the side corresponding to the lower surface of the insulation layer 380. In this manner, the circuit substrate 370 is completed. As illustrated in FIG. 14(B), at the front side of the circuit substrate 370, the first front side circuit pattern 371, the second front side circuit pattern 372, and the third front side circuit pattern 373 are fixed to the insulation layer 380 through the adhesive 350. At the back side of the circuit substrate 370, the back side circuit pattern 390 is fixed to the insulation layer 380 through the adhesive 350.

The circuit patterns 371 to 373 and 390 are fixed using the adhesive 350. The superimposed zones 371A, 372A, 373A, and 390A to 390C are pressed from the side corresponding to the front side and the side corresponding to the back side when pressing is carried out to form the substrate and produce adhesive force to fix the circuit patterns 371 to 373 and 390 mainly. The zones exposed to the adhesive 350, except for the superimposed zones 371A, 372A, 373A, and 390A to 390C, are pressed from the side corresponding to the front side or the side corresponding to the back side at positions between the corresponding side and the insulation layer 380 and also generate adhesive force, which is small compared to the adhesive force produced by any of the superimposed zones 371A, 372A, 373A, and 390A to 390C. The circuit patterns 371 to 373 and 390 are reliably fixed to the insulation layer 380 through the adhesive force produced by the superimposed zones 371A, 372A, 373A, and 390A to 390B.

The adhesive 350 is not restricted to the adhesive sheet having the rectangular shape corresponding to the shape of the insulation layer 382. That is, the adhesive sheet may be cut into shapes corresponding to the shapes of the circuit patterns 371 to 373 and 390 and applied onto the circuit patterns 371 to 373 and 390. The circuit patterns 371 to 373 and 390 are then fixed to the insulation layer 380. In this case, the superimposed zones are formed on the adhesive 350 applied onto the circuit patterns 371 to 373 and 390. In the superimposed zones on the circuit substrate, the adhesive 350 produces adhesive force to fix the circuit patterns 371 to 373 and 390 mainly. Alternatively, the adhesive 350 may be an application type instead of an adhesive sheet. When the application type adhesive is employed, the adhesive may be applied onto the circuit patterns 371 to 373 and 390 before the circuit patterns 371 to 373 and 390 are fixed to the insulation layer 380. Alternatively, the adhesive may be applied onto the insulation layer 380 before the circuit patterns 371 to 373 and 390 are fixed. Also in these cases, the superimposed zones on the circuit substrate generate adhesive force to fix the circuit patterns 371 to 373 and 390 mainly.

Subsequently, solder is poured into the recesses 324, which are formed in the front side circuit patterns 371 to 373. Using the solder in the corresponding recesses 324, the electronic component 311 is mounted on the circuit substrate 370. For example, as illustrated in FIGS. 14(A) and 14(B), using the solder supplied in the recesses 324 of the first front side circuit pattern 371 and the second front side circuit pattern 372, the front side circuit patterns 371, 372 may be electrically connected to the electronic component 311.

As has been described, in the fourth embodiment, the circuit substrate 370 is configured by fixing the multiple front side circuit patterns 371 to 373 to the top surface of the insulation layer 380 through the adhesive 350 and fixing the back side circuit pattern 390 to the lower surface of the insulation layer 330 through the adhesive 350. Since the adhesive 350 is epoxy resin, the comparative tracking index (CTI) of the adhesive 350, which is a characteristic representing the level of insulation performance of the material, is 600 or greater, or, in other words, high compared to other types of resin. The epoxy resin used as the adhesive 350 decreases the creepage distance between traces of the circuit patterns, compared to a conventional case. The size and weight of the circuit substrate 370 are thus reduced. Also, resin is not supplied between traces of the circuit patterns in the circuit substrate using the epoxy resin as the adhesive 350. As a result, the circuit substrate has improved heat dissipation performance compared to, for example, a circuit substrate in which each circuit pattern is wrapped in resin to enhance insulation performance.

In the fourth embodiment, the front side circuit patterns 371 to 373 are fixed to the front side of the insulation layer 330. The back side circuit pattern 390, which is a plate formed of the same material as the material of the front side circuit patterns 371 to 373, is fixed to the back side of the insulation layer 380, which is opposite to the front side. The circuit substrate 370 has the superimposed zones 371A to 373A and 390A to 390C. The front side circuit patterns 371 to 373 and the back side circuit pattern 390 are fixed such that the superimposed zones 371A to 373A and 390A to 390C are formed. This prevents the insulation layer 330 from warping due to a difference in linear expansion between each front side circuit pattern 371 to 373, which is fixed to the corresponding fixing surface of the insulation layer 330, and the insulation layer 330.

In the fourth embodiment, the adhesive 350 does not contain glass fibers or fillers. Accordingly, epoxy resin that produces high adhesive force compared to the epoxy resin used in the prepreg is thus employed as the adhesive 350. Also, since the adhesive 350 is free from glass fibers or fillers, exposure of the circuit patterns 371 to 373 to the glass fibers or fillers in the adhesive 350, which may form a starting point for peeling, is prevented. Further, the adhesive 350 produces great adhesive force compared to a conventional case, thus making it unnecessary to subject the adhesion surfaces of the circuit patterns to roughening to increase the adhesive force.

In the fourth embodiment, the circuit patterns 371 to 373 and 390 are molded in advance through pressing and then fixed using the adhesive 350. As a result, it is unnecessary to perform a step of deposition or etching that involves use of liquid.

In the fourth embodiment, each superimposed zone 371A, 372A, 373A, and 390A to 390C, in which the corresponding front side circuit pattern 371 to 373 and the back side circuit pattern 390 are superimposed on each other, is set on the corresponding circuit patterns 371 to 373 and 390, which are formed on the opposite surfaces of the insulation layer 380. The circuit patterns 371 to 373 and 390 are fixed to the insulation layer 380 mainly through the adhesive force produced in the superimposed zones 371A, 372A, 373A, and 390A to 390B. This reliably fixes the circuit patterns 371 to 373 and 390 to the insulation layer 380. Further, the circuit patterns 371 to 373 and 390 are shaped in advance through pressing to reliably set the superimposed zones 371A, 372A, 373A, and 390A to 390C. As a result, for example, even when the multiple independent front side circuit patterns 371 to 373 are formed at the front side, the superimposed zones 371A, 372A, 373A are set for interposition of the adhesive 350. This prevents peeling of any specific one of the circuit patterns.

In the circuit substrate 370 according to the fourth embodiment, the recesses 324 for mounting the corresponding electronic components 311 are formed in the first front side circuit pattern 371 and the second front side circuit pattern 372. Solder is poured into the recesses 324 and used to electrically connect the circuit patterns 371, 372 to the electronic components 311. This makes it unnecessary to form a stopper on any of the circuit patterns to prevent leakage of solder.

In the fourth embodiment and its modifications, through holes for positioning the circuit patterns 371 to 373 and 390 and the insulation layer 380 relative to one another at the time of their fixation may be formed in the circuit patterns 371 to 373 and 390 and the insulation layer 380, as in the wiring substrate 10 and the method for manufacturing the wiring substrate 10 according to the first embodiment. A positioning pin is passed through each one of the through holes and, in this state, the circuit patterns 371 to 373 and 390 are fixed to the insulation layer 380 using the adhesive 350. In this configuration, simply by passing positioning members such as the positioning pins through the corresponding through holes, the circuit patterns 371 to 373 and 390 and the insulation layer 380 are positioned.

In the fourth embodiment and its modifications, the front side circuit patterns 371 to 373 may be connected together through joint portions as in the case of the method for manufacturing the wiring substrate 10 according to the first embodiment. In this case, the joint portions connect the front side circuit patterns 371 to 373 together as an integral body. The front side circuit patterns 371 to 373 are fixed to the insulation layer 380 as the integral body using the adhesive 350. Afterwards, the joint portions are cut. In this manner, even though the front side circuit patterns 371 to 373 are not electrically connected together, the front side circuit patterns 371 to 373 are fixed to the insulation layer 380 while maintaining the positions of the front side circuit patterns 371 to 373 relative to one another.

Also, the joint portions for connecting the front side circuit patterns 371 to 373 as the integral body may be arranged such that the projection of each of the joint portions onto the lower surface of the insulation layer 380 becomes spaced from the back side circuit pattern 390 at least by a predetermined interval. This arrangement ensures the distance corresponding to the interval between the corresponding cut portion and the back side circuit pattern 390 even after the joint portion is cut off through punching for removing the joint portions.

In the fourth embodiment and its modifications, the insulation layer 380 and the adhesive 350 may be a core material having improved heat transmission performance compared to a resin layer typically employed as an insulation layer, which is, for example, a core material that is partially or entirely formed of metal, and adhesive with enhanced insulation performance. In this case, the core material used as the base material does not have to be an insulating type. This allows employment of a member having improved heat transmission performance as the core material. The core material herein corresponds to one example of the base material set forth in the claims.

The present invention is not restricted to the illustrated embodiments but may be embodied in the forms described below. Also in these forms, the same advantages as the advantages of the illustrated embodiments are obtained.

(1) The through hole for receiving the positioning pin 3a and the through hole for receiving the positioning pin 3b of the first embodiment do not necessarily have to be formed in the first pattern portion 21 and the second pattern portion 22, respectively, in the front side wiring pattern 20. For example, the through holes may be arranged in portions to be removed at the time of separation into the independent pieces. In this case, the portions including the through holes are removed after the positioning pins are passed through the through holes to fix the corresponding members. As a result, the wiring substrate is completed without a positioning through hole.

(2) The number of the positioning through holes in the wiring patterns 20, 40 and the insulation layer 30 of the first embodiment may be increased so that the joint portions 25, 26, which connect the corresponding pattern portions 21 to 23 together in the front side wiring pattern 20, can be omitted.

(3) The third pattern portion 23 and a portion of the back side wiring pattern 40 of the first embodiment may be fastened together and fixed to the casing 1 using the screw 12, which is passed through the through hole 23a of the third pattern portion 23, so that interlayer electrical connection can be brought about between the wiring patterns 20, 40.

DESCRIPTION OF THE REFERENCE NUMERALS 10, 10c . . . Wiring Substrate, 11, 280, 311 . . . Electronic Component Serving as Component, 13, 14 . . . Through Hole, 20 . . . Front Side Circuit Pattern Serving as Wiring Pattern, 21 . . . First Pattern Portion, 22 . . . Second Pattern Portion, 23 . . . Third Pattern Portion, 24, 324 . . . Recess Serving as Mounting Pad, 25, 26, 97 . . . Joint Portion, 30, 94, 380 . . . Insulation Layer Serving as Base Material, 40 . . . Back Side Circuit Pattern Serving as Wiring Pattern, 41, 42 . . . Through Hole, 50, 95, 350 . . . Adhesive, 51 . . . First Coil, 52 . . . First End Portion, 53 . . . Second End Portion, 62 . . . Second Coil, 62A . . . First Winding Portion, 62B . . . Second Winding Portion, 62C . . . Third Winding Portion, 62D . . . Fourth Winding Portion, 63 . . . First End Portion, 64 . . . Second End Portion, 65 . . . Holding Joint Portion, 66 . . . Holding Joint Portion, 91 . . . First Circuit Pattern Serving as First Pattern Portion, 92 . . . Second Circuit Pattern, 94a . . . Insertion Hole, 210 . . . Printed Wiring Substrate Serving as Wiring Substrate, 220 . . . Back Side Plate-Like Circuit Pattern Serving as Back Side Wiring Pattern, 222 . . . Pattern Projection, 230 . . . First Resin Layer Serving as Base Material, 240 . . . Front Side Plate-Like Circuit Pattern Serving as Front Side Wiring Pattern, 250 . . . Second Resin Layer, 251A, 251B . . . Pad Serving as Mounting Pad, 270, 271A . . . Solder, 290D . . . Lower Die, 290U . . . Upper Die, 370 . . . Circuit Substrate Serving as Wiring Substrate, 371 . . . First Front Side Circuit Pattern Serving as Front Side Wiring Pattern, 372 . . . Second Front Side Circuit Pattern Serving as Front Side Wiring Pattern, 373 . . . Third Front Side Circuit Pattern Serving as Front Side Wiring Pattern, 390 . . . Back Side Circuit Pattern Serving as Back Side Wiring Pattern

The invention claimed is:

1. A wiring substrate, comprising:
   a metal plate;
   a wiring pattern formed by the metal plate; and
   a base material to which the wiring pattern is fixed,
   wherein the wiring pattern has a mounting pad on a first surface of the wiring pattern for surface-mounting a component,
   the mounting pad comprises a recess that is filled with solder to surface-mount the component,
   the component elongates in a longitudinal direction, the recess has a width direction and a depth direction that are perpendicular to the longitudinal direction, and a dimension of the recess is greater than a dimension of the component in the width direction,
   the component is mounted on the surface of the wiring pattern such that two ends of the component are positioned between two ends of the recess in the width direction, and one end of the component in the longitudinal direction is positioned within the entire periphery of the recess, and
   the recess is provided at a position spaced from edges of the wiring pattern,
   a bottom surface of the component mounted on the mounting pad contacts with the solder filled in the recess, and
   a dimension between the bottom surface of the component and the bottom of the recess is equal to or greater than a dimension of the recess in the depth direction, and
   the wiring pattern has a second surface, a part of the second surface being fixed to the base material.

2. The wiring substrate according to claim 1, wherein the mounting pad is formed in a plurality, the plurality of mounting pads each have a component mounting surface, the component mounting surfaces of the plurality of mounting pads are configured to mount a single component, and the component mounting surfaces are flush with each other.

3. The wiring substrate according to claim 2, wherein
   the wiring pattern has a first pattern portion and a second pattern portion that are formed using one metal plate as an integral body connected together through a joint portion,
   the joint portion is cut off after the first pattern portion and the second pattern portion are fixed to the base material, and
   the mounting pads are formed in the first pattern portion and the second pattern portion.

4. The wiring substrate according to claim 3, wherein the joint portion is cut off in a pressing step.

5. The wiring substrate according to claim 4, wherein the wiring pattern is a first wiring pattern, and
   further comprising a second metal plate forming a second wiring pattern, wherein:
   the first wiring pattern is fixed to one surface of the base material; and the second wiring pattern is fixed to another surface of the base material, wherein the first wiring pattern has a cut portion formed by cutting off the joint portion, and in planar projection of the wiring substrate, an end portion of the second wiring pattern located closest to the cut portion of the first wiring pattern is arranged at a position that does not overlap the position of the cut portion in the first wiring pattern.

6. The wiring substrate according to claim 2, wherein the wiring pattern is a first wiring pattern, further comprising a second metal plate forming a second wiring pattern, wherein:

the first wiring pattern is fixed to a front surface of the base material; and the second wiring pattern fixed to a back surface of the base material, wherein the second wiring pattern has a pattern projection including a top portion located at a position corresponding to a front surface of the first wiring pattern, the first wiring pattern has an opening for receiving the pattern projection, and the mounting pads are provided on the first wiring pattern and the top portion of the pattern projection.

7. The wiring substrate according to claim 3, wherein a holding joint portion is provided between a portion of the wiring pattern and another portion of the wiring pattern, the holding joint portion being cut off after the wiring pattern is fixed to the base material.

8. The wiring substrate according to claim 4, wherein the base material has an insertion hole arranged at a position overlapping the position of the joint portion.

9. The wiring substrate according to claim 1, wherein an outermost surface of the wiring substrate is a surface of the wiring substrate that is other than the mounting pads, located equally or more outward from the mounting pads, and a flat zone having the largest surface area.

10. The wiring substrate according to claim 1, wherein a plate formed of the same material as the material of the wiring pattern is fixed to the surface of the base material opposite to the surface to which the wiring pattern is fixed.

11. The wiring substrate according to claim 1, wherein the wiring pattern includes a coil.

12. The wiring substrate according to claim 1, wherein another part of the second surface is fixed to a casing portion.

13. The wiring substrate according to claim 12, wherein another part of the second surface is fixed to a projection portion of the casing portion.

\* \* \* \* \*